United States Patent
Han et al.

(10) Patent No.: US 11,339,525 B2
(45) Date of Patent: May 24, 2022

(54) LAUNDRY TREATING APPARATUS

(71) Applicant: LG ELECTRONICS INC., Seoul (KR)

(72) Inventors: Jonghee Han, Seoul (KR); Jinho Yang, Seoul (KR); Jaeseok Seong, Seoul (KR); Jungsang You, Seoul (KR); Jaehoon Choi, Seoul (KR); Youngsoo Ha, Seoul (KR); Kyungah Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/508,593

(22) Filed: Jul. 11, 2019

(65) Prior Publication Data

US 2019/0330785 A1 Oct. 31, 2019

Related U.S. Application Data

(63) Continuation of application No. 14/295,827, filed on Jun. 4, 2014, now Pat. No. 10,392,737.

(30) Foreign Application Priority Data

Jun. 4, 2013 (KR) .................. 10-2013-0064077
Apr. 18, 2014 (KR) .................. 10-2014-0046922

(51) Int. Cl.
*D06F 39/14* (2006.01)
*D06F 39/02* (2006.01)
(Continued)

(52) U.S. Cl.
CPC .............. *D06F 39/14* (2013.01); *H05K 7/02* (2013.01); *H05K 7/1427* (2013.01); *D06F 34/28* (2020.02);
(Continued)

(58) Field of Classification Search
CPC ............. D06F 39/005; D06F 2058/283; D06F 2210/00; D06F 2212/00; D06F 2216/00;
(Continued)

(56) References Cited

U.S. PATENT DOCUMENTS 5,363,578 A    11/1994 Chelsey et al.
2004/0045150 A1  3/2004 Fitton et al.
(Continued)

FOREIGN PATENT DOCUMENTS

CN     1455832     11/2003
DE     3621260 A1   1/1988
(Continued)

OTHER PUBLICATIONS

JP2012223344—Machine Translation (Year: 2012).*
(Continued)

*Primary Examiner* — Marc Lorenzi
(74) *Attorney, Agent, or Firm* — KED & Associates LLP

(57) ABSTRACT

A laundry treating apparatus is provided that may include a cabinet having a laundry opening formed therein, a door mounted to the cabinet to open and close the laundry opening, and a control panel arranged at or on the cabinet. The control panel may include a control panel body that projects forward from a front plate. A front side of the control panel body may be sloped to face upward, thereby permitting enhanced utilization of an inside space of the cabinet, easy display of information on the control panel to a user, and easy operation of the control panel by a user.

3 Claims, 23 Drawing Sheets

(51) Int. Cl.
 *D06F 39/12* (2006.01)
 *H05K 7/14* (2006.01)
 *H05K 7/02* (2006.01)
 *D06F 58/20* (2006.01)
 *D06F 34/28* (2020.01)

(52) U.S. Cl.
 CPC .............. *D06F 39/02* (2013.01); *D06F 39/12* (2013.01); *D06F 58/20* (2013.01)

(58) Field of Classification Search
 CPC .......... D06F 37/10; D06F 37/18; D06F 39/12; D06F 34/28; D06F 34/34; D06F 39/02; D06F 39/14; A47L 15/4293
 See application file for complete search history.

(56) References Cited

U.S. PATENT DOCUMENTS

| | | |
|---|---|---|
| 2005/0097679 A1 | 5/2005 | Kim et al. |
| 2005/0178167 A1 | 8/2005 | Kim et al. |
| 2005/0183469 A1 | 8/2005 | Kang |
| 2005/0210926 A1 | 9/2005 | Kwon et al. |
| 2007/0193309 A1 | 8/2007 | Kim |
| 2007/0193311 A1 | 8/2007 | No et al. |
| 2007/0209403 A1 | 9/2007 | Byun et al. |
| 2008/0256989 A1* | 10/2008 | Jeong ..................... D06F 58/14 68/5 C |
| 2008/0289940 A1 | 11/2008 | Kim et al. |
| 2009/0033185 A1 | 2/2009 | Park et al. |
| 2009/0056386 A1 | 3/2009 | Jang et al. |
| 2012/0096903 A1 | 4/2012 | Kim et al. |
| 2013/0014546 A1 | 1/2013 | Kobayashi et al. |
| 2013/0232810 A1* | 9/2013 | Coxon ..................... D06F 58/04 34/108 |

FOREIGN PATENT DOCUMENTS

| | | | |
|---|---|---|---|
| DE | 10141635 | | 3/2003 |
| DE | 102010002675 | | 12/2010 |
| DE | 10 2011 078 920 | | 1/2013 |
| EP | 1 529 873 | A1 | 5/2005 |
| EP | 2 380 479 | A1 | 10/2011 |
| EP | 2896735 | | 7/2015 |
| ES | 2172371 | | 9/2002 |
| JP | 2001-212396 | A | 8/2001 |
| JP | 2001-239091 | A | 9/2001 |
| JP | 2008-119054 | | 5/2008 |
| JP | 2009-095531 | | 5/2009 |
| JP | 2012-183108 | | 9/2012 |
| JP | 2012-223344 | | 11/2012 |
| JP | 2013-509283 | | 3/2013 |
| KR | 10-2005-0047770 | | 5/2005 |
| KR | 10-2005-0086199 | | 8/2005 |
| KR | 10-2007-0067463 | | 6/2007 |
| KR | 20070075543 | A * | 7/2007 |
| KR | 10-2009-0005486 | | 1/2009 |
| KR | 10-2013-0010654 | | 1/2013 |
| WO | WO 02/22937 | A1 | 3/2002 |
| WO | WO 2014/041799 | | 3/2014 |

OTHER PUBLICATIONS

KR20070075543—Machine Translation (Year: 2007).*
European Search Report dated Oct. 1, 2019 issued in EP Application No. 19178768.8.
European Search Report dated Nov. 5, 2014, issued in Application No. 14170780.2 (with English Translation).
Korean Office Action dated Sep. 10, 2015.
Chinese Office Action dated Nov. 4, 2015.
Japanese Office Action dated May 15, 2018.

* cited by examiner

LAUNDRY TREATING APPARATUS

CROSS-REFERENCE TO RELATED APPLICATION(S)

This application is a Continuation Application of U.S. application Ser. No. 14/295,827 filed Jun. 4, 2014, which claims priority under 35 U.S.C. § 119 to Korean Application Nos. 10-2013-0064077 filed in Korea on Jun. 4, 2013 and 10-2014-0046922 filed in Korea on Apr. 18, 2014, the entire disclosures of which are hereby incorporated by reference.

BACKGROUND

1. Field

A laundry treating apparatus for washing or drying laundry is disclosed herein.

2. Background

In general, a laundry treating apparatus is an apparatus for washing or drying laundry, such as clothes or other items, or an apparatus for performing both washing and drying the laundry. The laundry treating apparatus may include a cabinet having a laundry opening, a tub in the cabinet to hold washing water, a drum rotatably provided in the tub, a water supply device to supply the washing water to the tub, and a detergent supply device to supply detergent to the tub through the washing water being provided from the water supply device.

BRIEF DESCRIPTION OF THE DRAWINGS

Embodiments will be described in detail with reference to the following drawings in which like reference numerals refer to like elements, and wherein.

DETAILED DESCRIPTION

Figure 1:
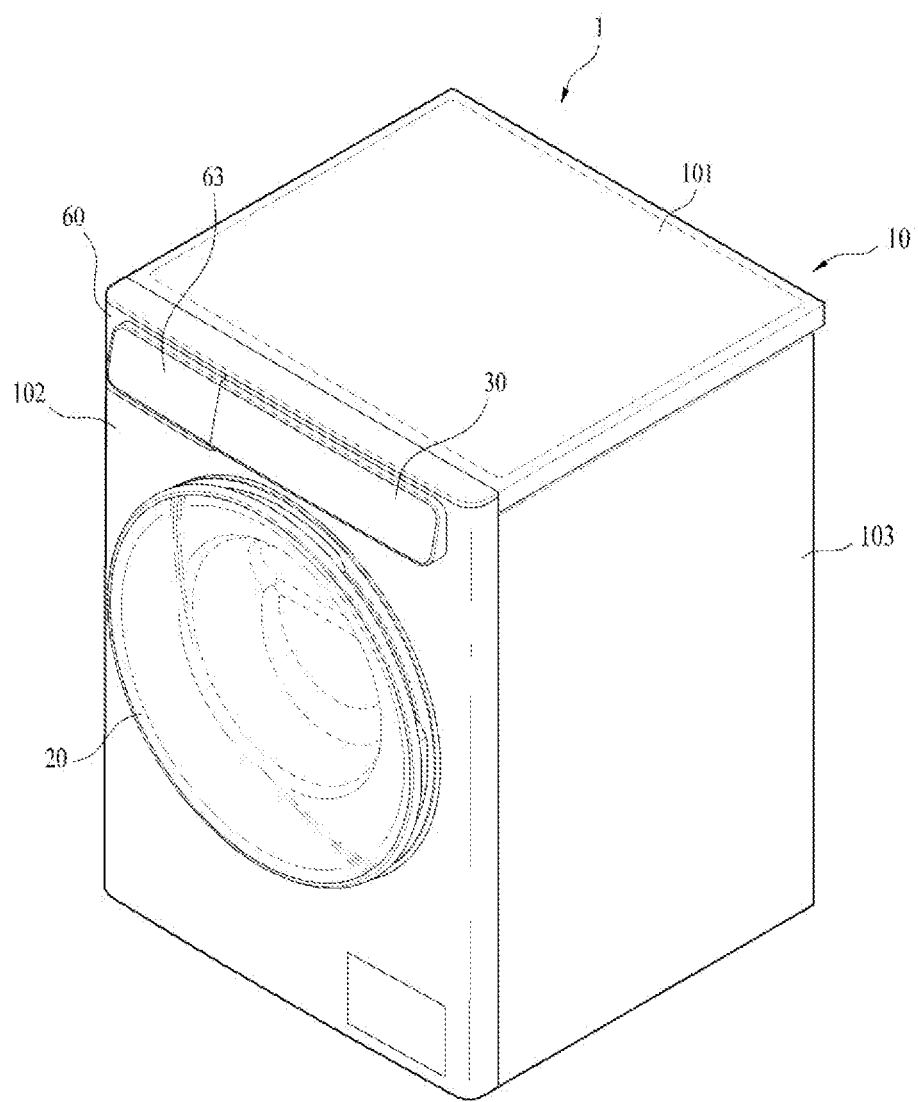
FIG. 1 is a perspective view of a laundry treating apparatus in accordance with an embodiment.

A laundry treating apparatus according to embodiments will be described in detail with reference to the appended drawings. Where possible, like reference numerals have been used to indicate like elements, and repetitive disclosure has been omitted.

The laundry treating apparatus in accordance with embodiments may be applicable both to a top loading type laundry treating apparatus having a laundry opening provided in a top side of a cabinet, and a front loading type laundry treating apparatus having the laundry opening provided in a front side (or, a side) of the cabinet. Embodiments will be described taking the front loading type laundry treating apparatus as an example.

The term "laundry treating apparatus" refers to all apparatuses that treat laundry. In more detail, the term "laundry treating apparatus" refers to a washing machine for removing contamination from laundry using washing water, a dryer for removing moisture from the laundry, and a washer-dryer having a drying function. The dryer may include a drum type dryer for supplying heated air to a rotatable drum to dry the laundry, and a cabinet type dryer (refresher) for supplying the heated air to a clothes receiving space in which clothes to be contaminated are received.

Though the embodiments will be described taking the front loading type washing machine with a rotatable drum to which the laundry is introduced through the front side of the cabinet as an example, embodiments do not exclude various types of laundry treating apparatuses, including those described above.

Figure 2:
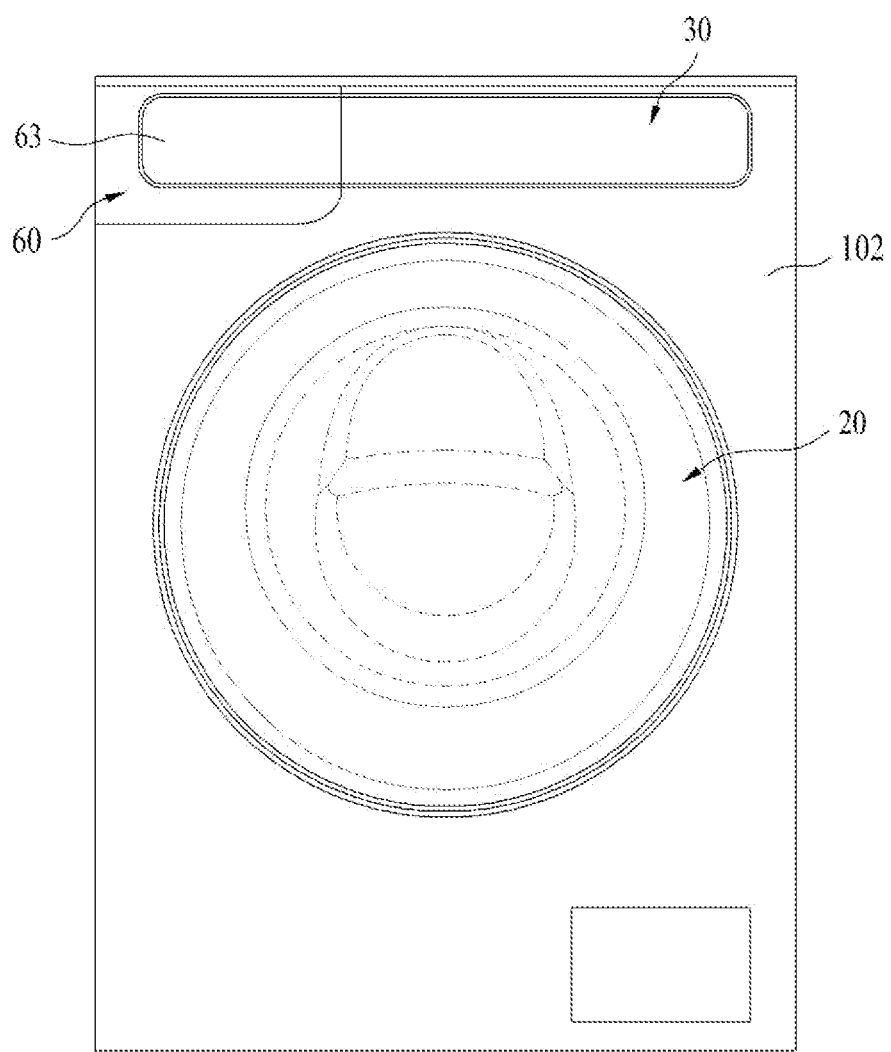
FIG. 2 is a front view of the laundry treating apparatus of FIG. 1.
Figure 3:
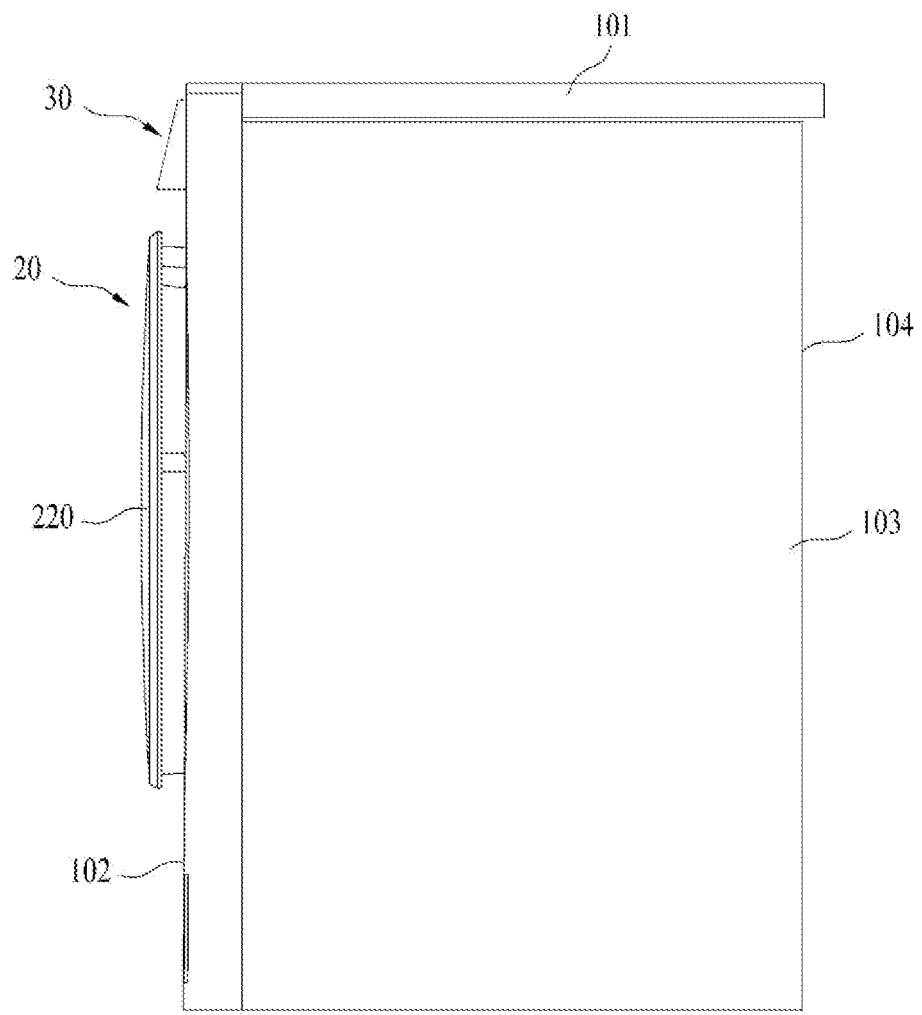
FIG. 3 is a side view of the laundry treating apparatus of FIG. 1.
Figure 4:
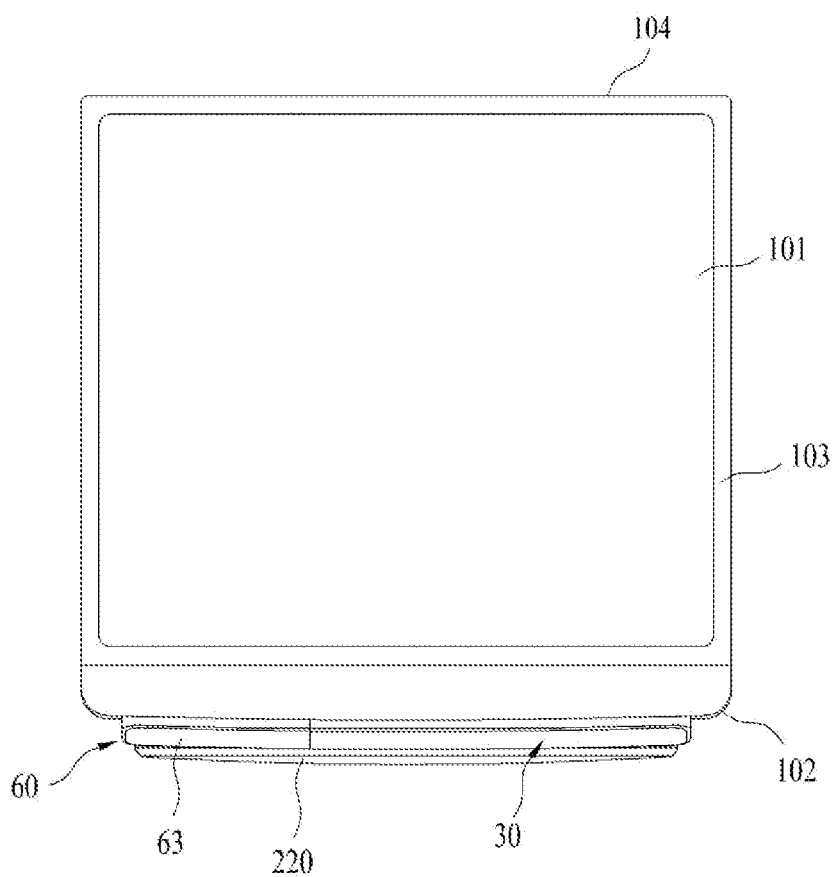
FIG. 4 is a plan view of the laundry treating apparatus of FIG. 1.
Figure 5:
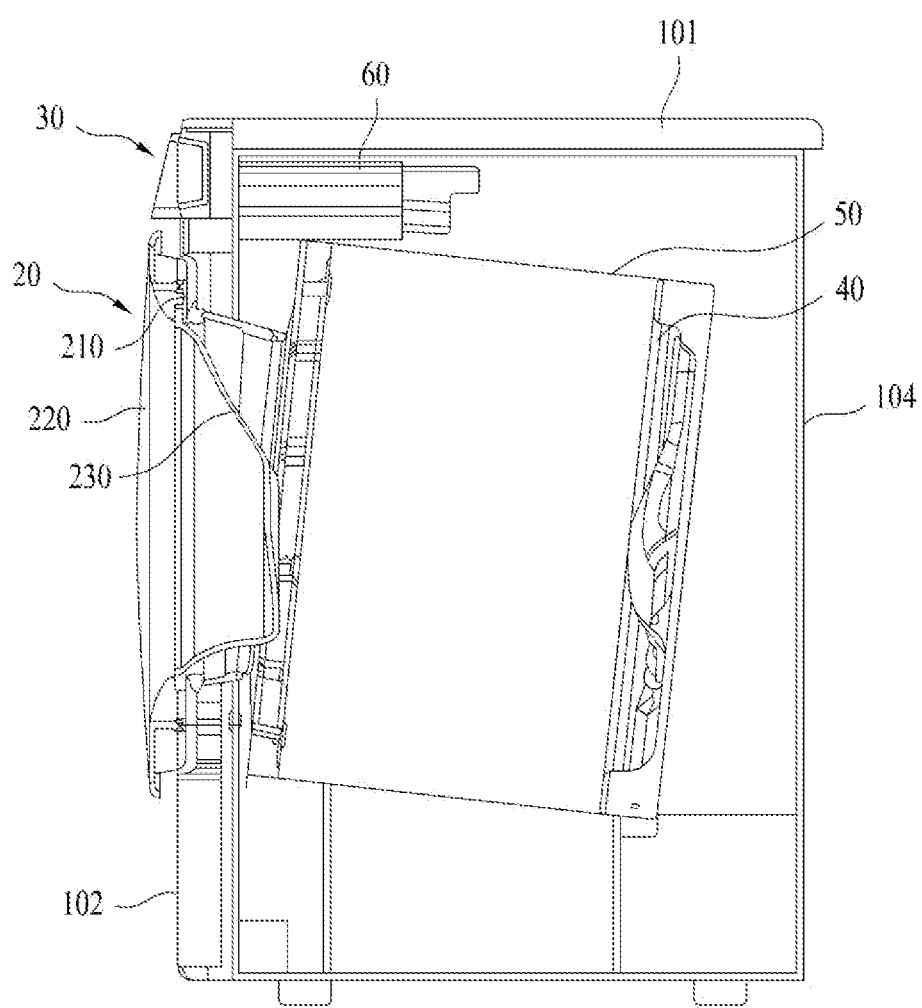
FIG. 5 is a cross-sectional view of the laundry treating apparatus of FIG. 1.

A laundry treating apparatus in accordance with an embodiment will be described, with reference to FIGS. 1 to 5. FIG. 1 is a perspective view of a laundry treating apparatus in accordance with an embodiment. FIG. 2 is a front view of the laundry treating apparatus of FIG. 1. FIG. 3 is a side view of the laundry treating apparatus of FIG. 1. FIG. 4 is a plan view of the laundry treating apparatus of FIG. 1. FIG. 5 is a cross-sectional view of the laundry treating apparatus of FIG. 1.

The laundry treating apparatus 1 of FIGS. 1-5 may include a cabinet 10, which may form an exterior appearance thereof, and a control panel 30 to receive control information from a user. A laundry opening 110 (see FIG. 6) may be formed in the cabinet 10. For example, the laundry opening 110 may be formed in a front side of the cabinet 10. The laundry treating apparatus 1 may further include a door 20 mounted to the cabinet 10 to open/close the laundry opening 110.

The cabinet 10 may include a laundry holding space provided therein, and a rotatable drum 40. The laundry may be held in the drum 40.

The cabinet 10 may include a front cover 102 arranged on a front side of the laundry treating apparatus 1, a rear cover 104 positioned opposite to the front cover 102, a top plate 101 provided at a top side of the front cover 102 and the rear cover 104, and a base (not shown) provided at a bottom side. The cabinet 10 may further include side covers 103 between the front cover 102 and the rear cover 104. As the front cover 102, the rear cover 104, the top plate 101, and the side covers 103 may be coupled together, a space may be formed to hold laundry and housing elements of the laundry treating apparatus 1 therein.

The front cover 102 may form a front side of the cabinet 10. The front cover 102 may have the laundry opening 110 formed therein for introduction of the laundry (see FIG. 6). The laundry opening 110 may be an opening, for introduction of the laundry to the drum 40, or taking the laundry out of the drum 40 through the laundry opening 110.

Referring to FIG. 5, the cabinet 10 may have the drum 40 provided therein. The drum 40 may be rotatably provided. The user may introduce laundry intended to be treated to an inside of the drum 40. If the laundry treating apparatus is a washing machine which removes contaminants from the laundry using washing water, the laundry treating apparatus may further include a tub 50. The tub 50 may be provided at an outside of the drum 40 to hold the washing water.

The front cover 102 may include a detergent supply device 60 provided thereto to hold detergent therein. The detergent supply device 60 may be provided as a drawer panel type, and may be provided with a drawer hand grip 63 to assist pushing in and pulling out of the detergent supply device 60.

Figure 6:
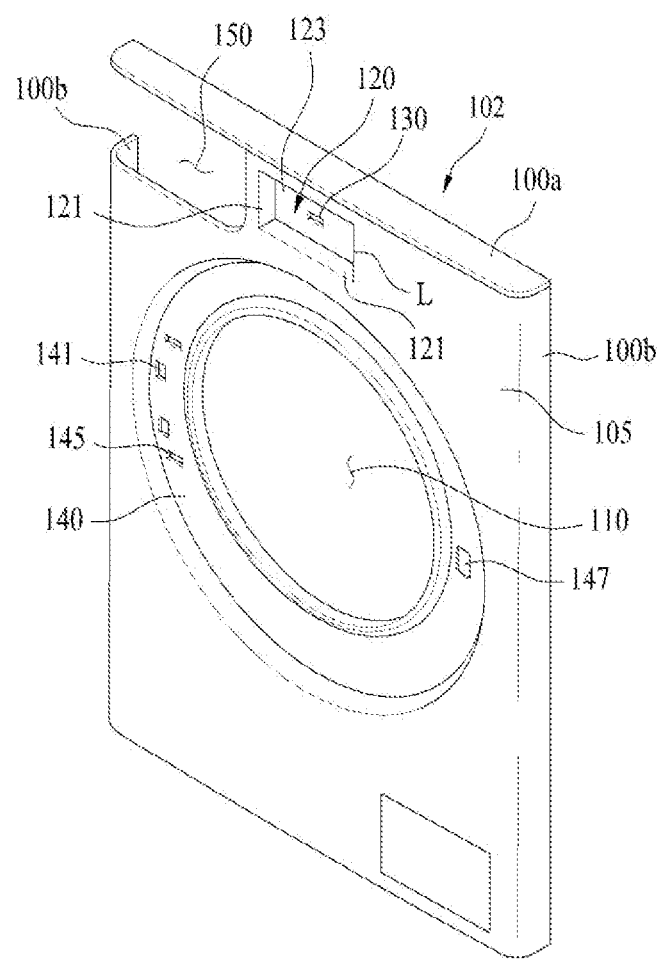
FIG. 6 is a perspective view of a front cover of the laundry treating apparatus of FIG. 1.
Figure 7:
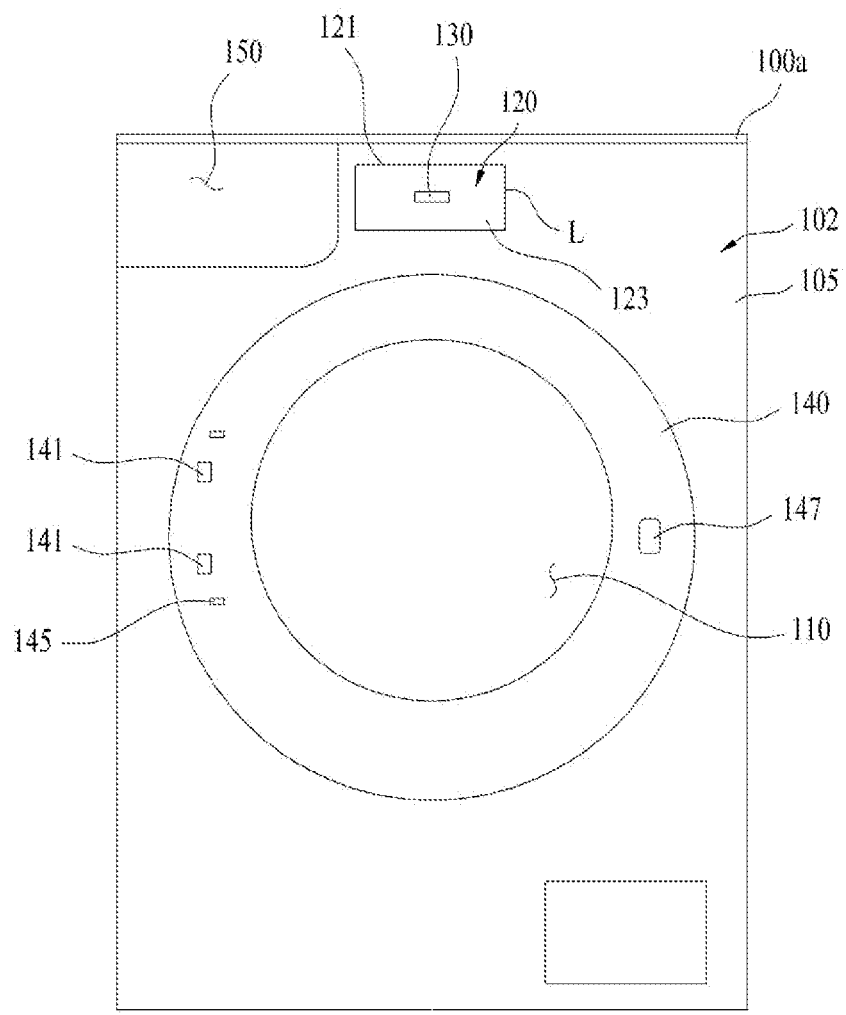
FIG. 7 is a front view of the front cover of FIG. 6.

The front cover 102 will be described in detail, with reference to FIGS. 6 and 7. FIG. 6 is a perspective view of the front cover of the laundry treating apparatus of FIG. 1. FIG. 7 is a front view of the front cover of FIG. 6.

The front cover 102 may include a front plate 105. The front cover 102 may further include a top flange 100a that extends from a top edge of the front plate 105 toward an inside of the cabinet 10. The front cover 102 may further include side flanges 100b that extend from both side edges of the front plate 105 toward the inside of the cabinet 10. The front cover 102 may further include a lower flange (not shown) that extends from a lower edge of the front plate 105 toward the inside of the cabinet 10. In this disclosure, the term "front side of the front cover 102" may refer to the front plate 105, or a front side of the front plate 105.

The control panel 30 may be arranged at or on the cabinet 10. One of rear sides of the front cover 102 or the control panel 30 may have a projected portion 320 provided thereto (see FIGS. 8-10), and the other one may have a recess 120 provided thereto to receive and house the projected portion 320 therein.

If the projected portion 320 is provided to or on the front cover 102, the rear side of the control panel 30 may have the recess 120 provided therein to receive the projected portion 320 of the front cover 102. Alternatively, if the projected portion 320 is provided to or on the rear side of the control panel 30, the recess 120 may be provided in the front cover 102 to receive the projected portion 320 of the control panel 30 therein.

Hereinafter, a case will be described as an example, in which the projected portion 320 is formed on the rear side of the control panel 30, and the recess 120 is formed in the front cover 102. However, embodiments are not limited thereto, and positions of the projected portion 320 and the recess 120 may be interchanged. As it will be apparent to persons skilled in this field of art, an example of interchange of the mounting positions of the projected portion 320 and the recess 120 has not been described herein, separately.

With this embodiment, the front cover 102 may include the recess 120 provided thereto for coupling the control panel 30 thereto. The recess 120 may be provided to or in the front plate 105, and the projected portion 320 provided to or at the rear side of the control panel 30 may be inserted into the recess 120.

The recess 120 may include a flange 121 that extends from the front side of the front plate 105 toward the inside of the cabinet 10 along a closed loop L. The recess 120 may further include a closing portion 123 that extends from the flange 121 to close an inside space of the loop L.

The recess 120 may have a predetermined width W1 (see FIG. 10) due to the flange 121. The recess 120 may have an opened front side, and a closed rear side due to the closing portion 123. The projected portion 320 of the control panel 30 may be inserted in the recess 120 through the opened front side of the recess 120.

The recess 120 may include a connection terminal 130 provided therein to be electrically coupled to a jack 330 (see FIG. 8) formed on the projected portion 320 of the control panel 30. The connection terminal 130 may be provided to the closing portion 123 of the recess 120. The connection terminal 130, when electrically connected to the jack 330, may serve as a window to supply power to the control panel 30 and exchange electric signal information with the control panel 30.

The recess 120 may be positioned on an upper side of the front plate 105. For example, the recess 120 may be positioned at a central portion of the upper side of the front plate 105.

The recess 120 may be positioned spaced a predetermined distance from a top side edge of the front plate 105. Between a top side edge of the recess 120 and the top side edge of the front plate 105, a portion of the front side of the front plate 105 may be provided. A surface positioned between the top side edge of the recess 120 and the top side edge of the front plate 105 may be on a same plane with the front side portion of the front plate 105 having no recess 120.

The laundry opening 110 may be provided to or at a central portion of the front plate 105. The laundry opening 110 may be circular. The laundry may be introduced into the drum 40 or taken out of the drum 40 through the laundry opening 110.

A seating portion 140 to seat a door frame of the door 20 thereon may be provided to or at an outside of the laundry opening 110. The seating portion 140 may be a portion on which an inner frame 210 of the door frame may be seated, and may be recessed toward an inside of the cabinet 10 from the front side of the front plate 105.

The seating portion 140 may include a hook hole 147 formed therein to be coupled with a hook 260 of the door 20. The seating portion 140 may include a hinge inserting hole 141 formed therein to receive a hinge arm 250 of the door 20 therein. The seating portion 140 may include a bracket coupling recess 145 formed therein to receive the bracket 240 of the door 20 coupled thereto. The seating portion 140 and a configuration in which the door 20 is coupled to the seating portion 140 will be described hereinbelow.

A mounting portion 150 may be provided on a side of the front plate 105 to receive the detergent supply device 60 mounted thereto. The mounting portion 150 may have the detergent supply device 60 coupled thereto. A hook hole (not shown) may be formed on a front side of the detergent supply device 60 to be coupled to the drawer hand grip 63, as described hereinbelow.

Figure 8:
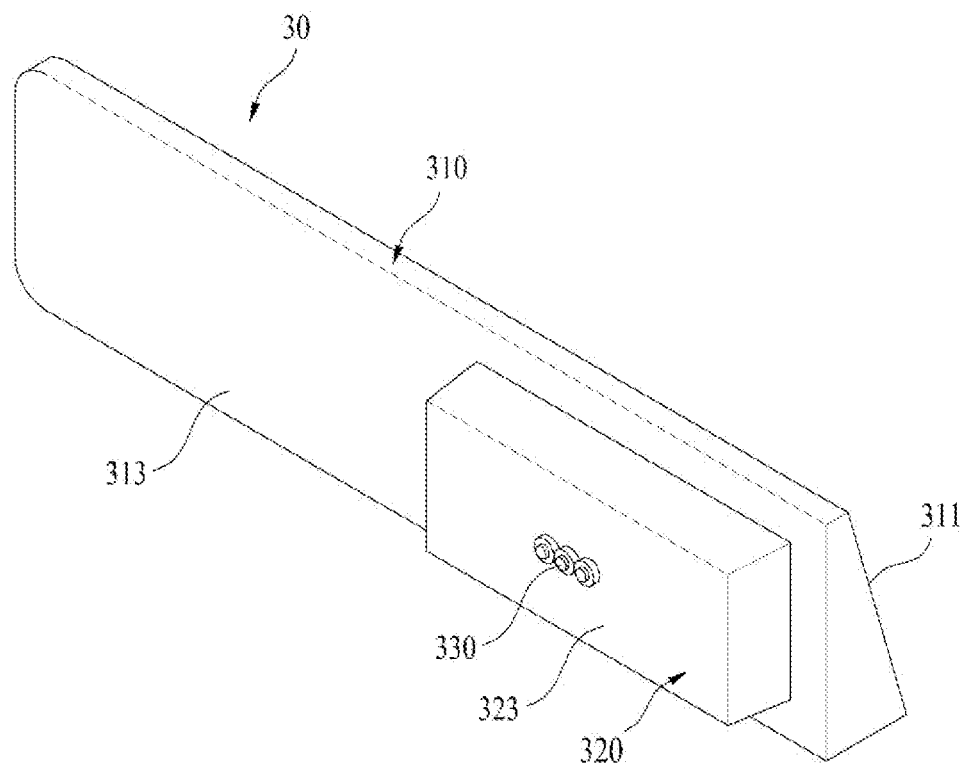
FIG. 8 is a perspective view of a rear side of a control panel of the laundry treating apparatus of FIG. 1.
Figure 9:
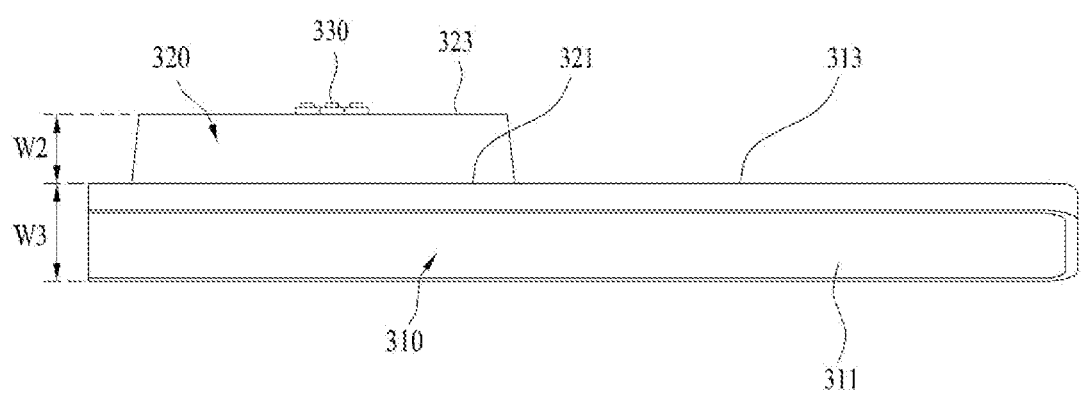
FIG. 9 is a plan view of the control panel of FIG. 9.
Figure 10:
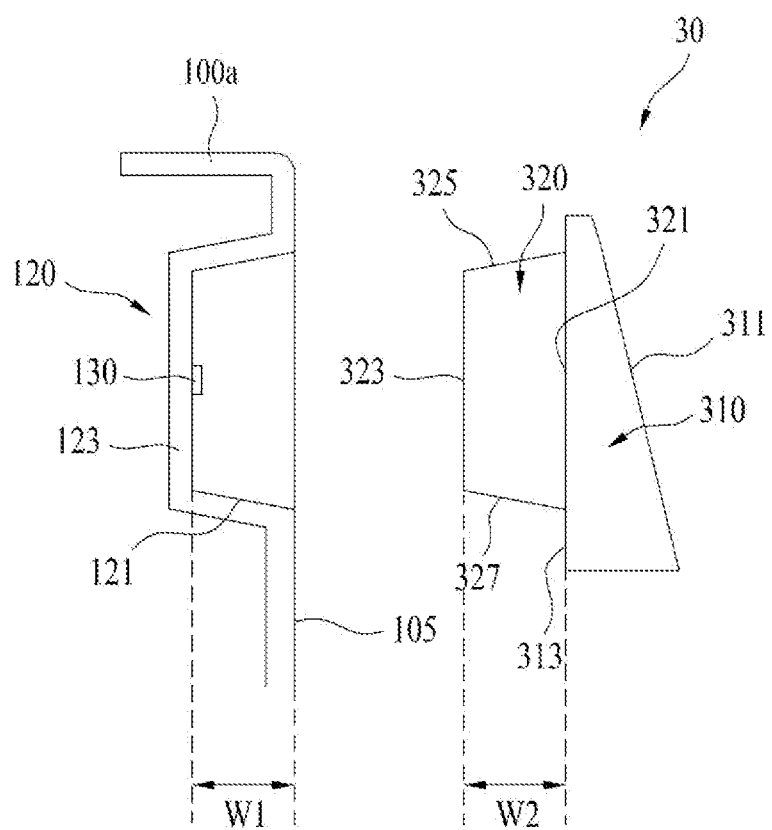
FIG. 10 is a side view illustrating coupling of the control panel coupled to the front cover of the laundry treating apparatus of FIG. 1.

The control panel 30 will be described with reference to FIGS. 8 to 10. FIG. 8 is a perspective view of a rear side of a control panel of the laundry treating apparatus of FIG. 1. FIG. 9 is a plan view of the control panel of FIG. 9. FIG. 10 is a side view illustrating coupling of the control panel coupled to the front cover of the laundry treating apparatus of FIG. 1.

Referring to FIGS. 8 to 10, the control panel 30 may have a control panel body 310 having a predetermined width W2. The control panel 30 may include the projected portion 320 provided to or at a rear side 313 of the control panel body 310. The projected portion 320 may be formed as one unit with the control panel body 310.

The control panel body 310 is an element to receive washing information from a user or display the washing information thereon, may have a front side 311 provided with at least one of an input to receive the washing information and/or a display (an output) to display the washing information thereon. The control panel body 310 may be provided with both the input and the display (the output unit).

The control panel body 310 may include the front side 311 having a predetermined width W3 exposed to an outside of the laundry treatment apparatus. The control panel body 310 may include the rear side 313 configured to face the front side of the front cover 102. In this case, the control panel body 310 may have the front side 311 sloped to face upward.

The laundry treating apparatus may be installed at a position lower than eyes of the user. In this case, the control panel 30 may be positioned at a position lower than the eyes of the user. In order to enhance visibility of the input and the display on the control panel 30, the front side 311 of the control panel body 310 may be sloped in a direction of the user's eyes. Therefore, if the rear side 313 of the control panel body 310 extends substantially vertically, a side of the control panel body 310 may have a trapezoidal shape.

The rear side 313 of the control panel body 310 may have the projected portion 320 provided thereto. The projected portion 320 may project from the rear side 313 of the control panel body 310 toward an inside of the cabinet 10. The projected portion 320 may be inserted into the recess 120 formed in the front plate 105 to be coupled and fixedly secure the control panel 30 to the front plate 105.

The projected portion 320 may have the predetermined width W2, and may include a front side 321 and a rear side 323. The front side 321 of the projected portion 320 may couple to the rear side 313 of the control panel body 310, and the rear side 323 of the projected portion 320 may seat on or in the closing portion 123 of the recess 120.

The jack 330 configured to be coupled to the connection terminal 130 of the recess 120 electrically may be provided to the rear side 323 of the projected portion 320. At least one of a microcomputer or a power source of the control panel 30, for example, electric elements to drive the control panel 30 may be provided inside of the projected portion 320.

The projected portion 320 may have a cross sectional area smaller than a cross-sectional area of the rear side 313 of the control panel body 310. The rear side 323 of the projected portion 320 coupled to the rear side 313 of the control panel body 310 may have an area smaller than an area of the rear side 313 of the control panel body 310. The projected portion 320 may be inserted into the recess 120 formed in the front plate 105.

The control panel body 310 may project forward from a front side of the front plate 105. The control panel body 310 may be mounted to project from the front side of the front plate 105. The front side of the control panel body 310 may be sloped to face upward.

A substantially horizontal or vertical cross-section of the control panel body 310 may have a rectangular shape having ratios of short sides to long sides that are not the same. That is, the control panel body 310 may have a rectangular bar shape. The long sides of the control panel body 310 may extend in a transverse direction of the front cover 102.

If the control panel body 310 has the rectangular shape, an area of the projected portion 320 may occupy approximately ½ to ⅒ of an area of the rear side 313 of the control panel body 310. That is, the area of the projected portion 310 may be approximately ½ to ⅓ of the area of the rear side 313 of the control panel body 310.

The projected portion 320 may deviate to one of a left side or a right side of the rear side 313 of the control panel body 310. The projected portion 320 may deviate to one of the left side or the right side in a lengthwise direction of the rear side 313 of the control panel body 310.

The recess 120 may be positioned at the central portion of the upper side of the front plate 105. If the projected portion 320 is positioned at a central portion of the rear side 313 of the control panel body 310, the control panel body 310 may interfere with the mounting portion 150. Therefore, the projected portion 320 may be provided to deviate to one side from the central portion of the control panel body 310. The projected portion 320 may be provided to deviate in a direction the mounting portion 150 is positioned.

Referring to FIG. 10, coupling of the control panel 30 to the front cover 102 will be described in detail hereinbelow.

The projected portion 320 of the control panel 30 may be inserted into the recess 120 formed in the front plate 105. The recess 120 may have a shape in conformity with an outside shape of the projected portion 320.

The projected portion 320 may be inserted into the recess 120 through an opened front side of the recess 120. In this case, the closing portion 123 of the recess 120 and the rear side 323 of the projected portion 320 may be closely coupled, and the connection terminal 130 provided to or on the closing portion 123 and the jack 330 provided to or on the rear side 323 of the projected portion 320 may be electrically coupled.

The projected portion 320 may have an upper side 325, a lower side 327, and sides coupled to the flange 121 of the recess 120 to be in contact therewith. If the projected portion 320 is inserted into the recess 120, the flange 121 and the upper side 325, the lower side 327, and the sides may couple to be in close contact with each other.

At least one of the upper side 325, the lower side 327, or the sides of the projected portion 320 may be provided sloped toward the central portion of the projected portion 320. As the flange 121 and the closing portion 123 of the recess 120 are in conformity with an outside shape of the projected portion 320, the flange 121 may be formed sloped outward from the central portion of the recess 120. By forming the sides of the projected portion 320 and the recess 120 to have slopes, alignment of the projected portion 320 with the recess 120 may be easy when the projected portion 320 is inserted into the recess 120.

The front side 321 of the projected portion 320 may project to an outside of the front plate 105. The width W2 of the projected portion 320 may be formed larger than the width W1 of the recess 120. However, the width W2 of the projected portion 320 may be the same as the width W1 of the recess 120. In this case, the width W1 of the recess 120 may refer to a depth of a space the recess 120 forms. That is, the width W1 does not include a thickness of the closing portion 123. Therefore, the front side 321 of the projected portion 320 may be positioned on a same plane with the front side of the front plate 105.

As the projected portion 320 projects from the rear side 313 of the control panel body 310, if the projected portion 320 is inserted into, and coupled to, the recess 120, the control panel body 310 may project to an outside of the front plate 105. In other words, the control panel body 310 may project forward from the front cover 102 (the front plate 105).

In this case, the term "forward" may mean an outside direction of the cabinet 10, and if the projected portion 320 is inserted into the recess 120, the projected portion 320 may be coupled to the recess 120, such that the rear side 313 of the control panel body 310 abuts the front side of the front plate 105. Further, an upper side 311a, a lower side 311b, and the front side 311 of the control panel body 310 may project to an outside of the front plate 105. Along with this, the rear side 313 of the control panel body 310 may be in close contact with the front side of the front plate 105.

Figure 11:
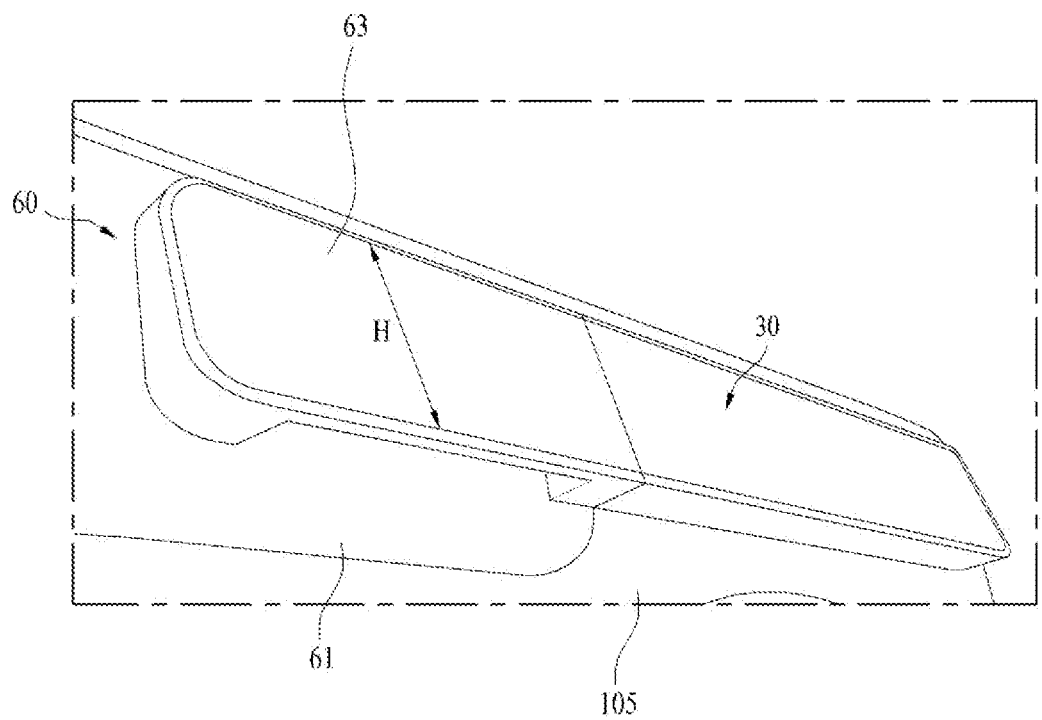
FIG. 11 is a perspective view illustrating an exterior appearance of a bottom side of a detergent supply device of the laundry treating apparatus of FIG. 1.
Figure 12:
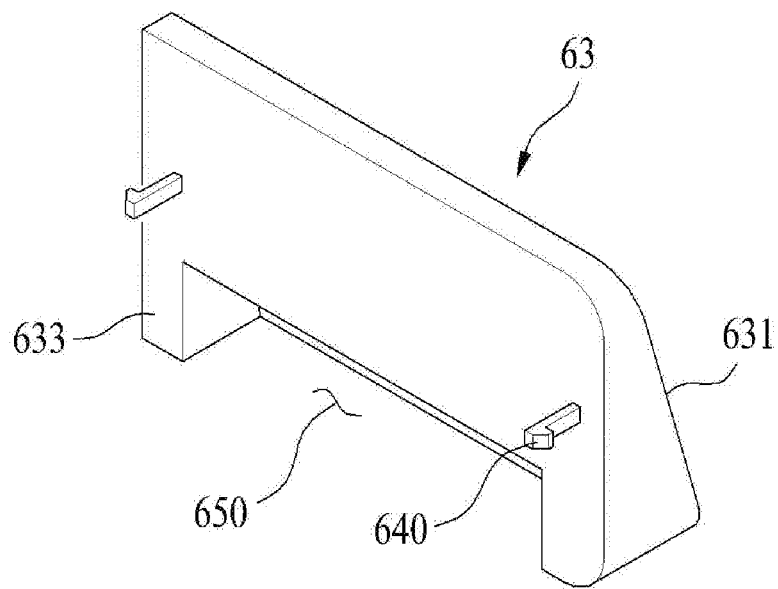
FIG. 12 is a back side perspective view of a hand grip of the laundry treating apparatus of FIG. 1.
Figure 13:
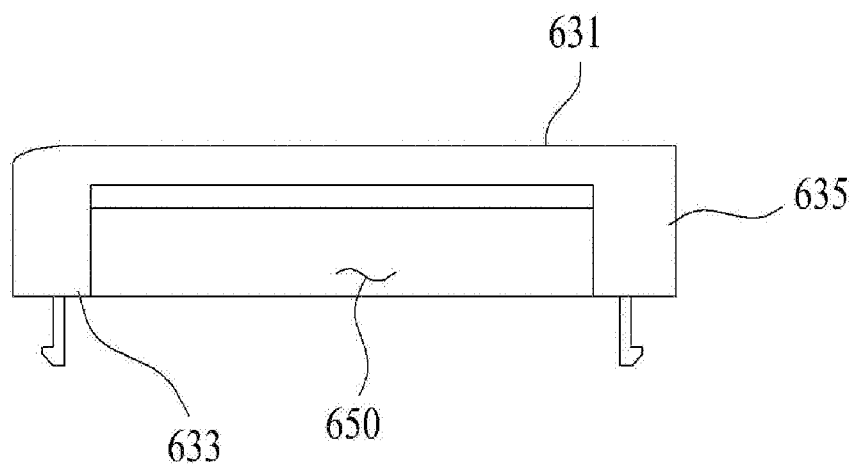
FIG. 13 is a bottom view of the hand grip of FIG. 12.

FIG. 11 is a perspective view illustrating an exterior appearance of a bottom side of a detergent supply device of the laundry treating apparatus of FIG. 1. FIG. 12 is a back side perspective view of a hand grip of the laundry treating apparatus of FIG. 1. FIG. 13 is a bottom view of the hand grip of FIG. 12.

Referring to FIGS. 11 to 13, the detergent supply device 60 may include a drawer panel 61 which enables the detergent supply device 60 to be pushed into and pulled out of the cabinet 10. The detergent supply device 60 may include a drawer hand grip 63 provided to or on the front side of the drawer panel 61 for the user's hand to hold thereon to push into and pull out the drawer panel 61. The user may hold the drawer hand grip 63 and push or pull the drawer panel 61 into and out of the cabinet 10.

The drawer panel 61 may have a space to hold the detergent therein. If the drawer panel 61 is pushed into the cabinet 10, the front side of the drawer panel 61 may be positioned on a same plane with the front side of the front cover 102.

Referring to FIGS. 12 and 13, the drawer hand grip 63 may have an underside 635 and a rear side 633 with a cut-away portion 650 formed recessed in portions thereof. The cut-away portion 650 may not be formed in the front side of the drawer hand grip 63, and the user may put a hand therein to hold the drawer hand grip 63. That is, if the user puts his or her fingers into the cut-away portion 650 and pushes or pulls the front side 631 of the drawer hand grip 63, the drawer panel 61 may be pushed in or pulled out, respectively.

The drawer hand grip 63 may be formed to have a same shape as the control panel body 310. That is, if provided to or at the front side of the drawer panel 61, the drawer hand grip 63 may be fabricated to give a sense of unity with the control panel body 310.

The drawer hand grip 63 may have a width substantially the same as the width W3 of the control panel body 310, and a height H of the front side 631 may be substantially the same as a height of the control panel body 310.

The front side 631 of the drawer hand grip 63 may be formed sloped to face upward the same as the front side 311 of the control panel body 310. Therefore, if the drawer panel 61 is pushed in, the front side 631 of the drawer hand grip 63 may be positioned substantially on the same plane as the front side 311 of the control panel body 310.

The rear side 633 of the drawer hand grip 63 may have a coupling member 640 provided thereto to couple the drawer hand grip 63 to the drawer panel 61. The coupling member 640 may be, for example, a hook having a holding step. The hook 640 may be inserted in a hook hole (not shown) formed in a front side of the drawer panel 61 to couple the drawer hand grip 63 to the drawer panel 61.

Figure 14:
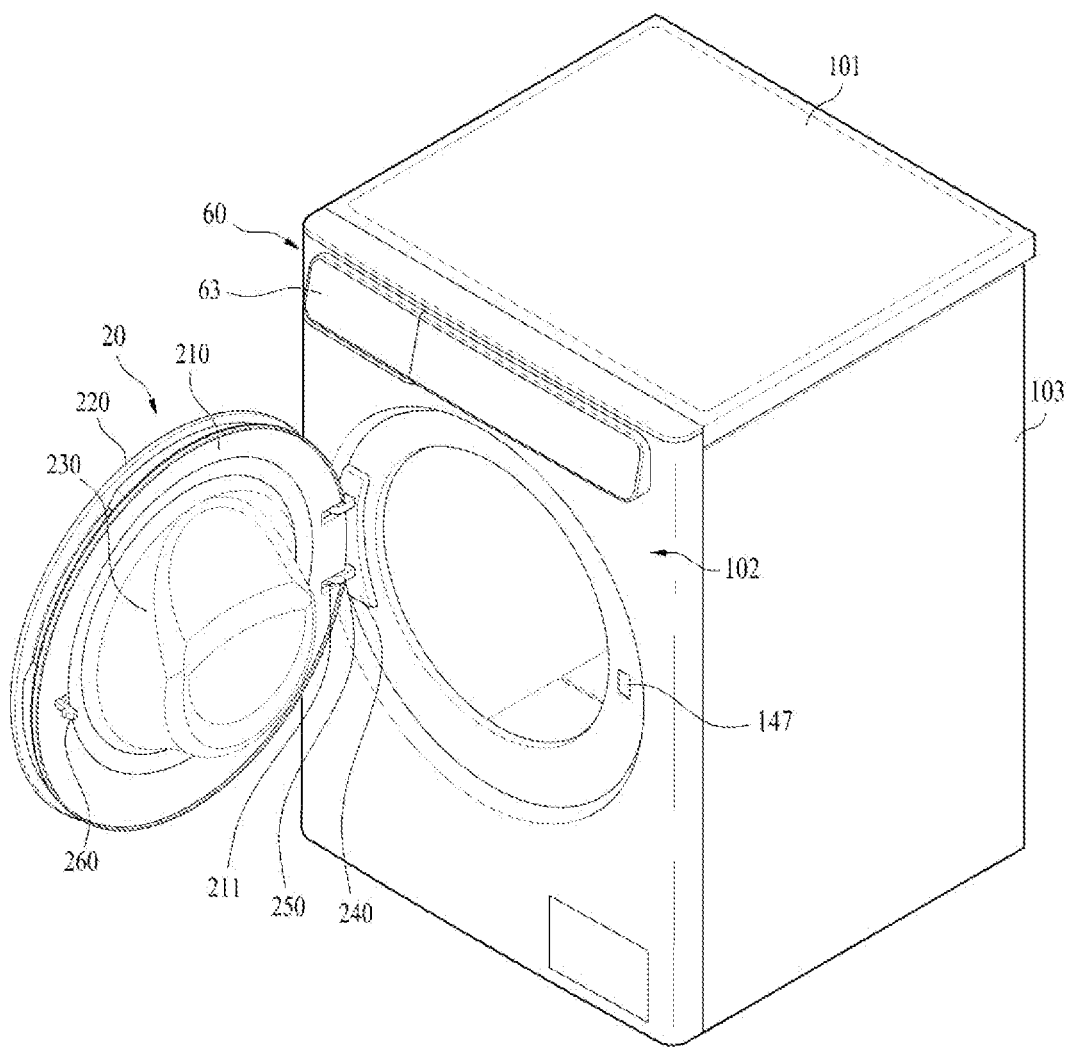
FIG. 14 is a perspective view of the laundry treating apparatus of FIG. 1.
Figure 15:
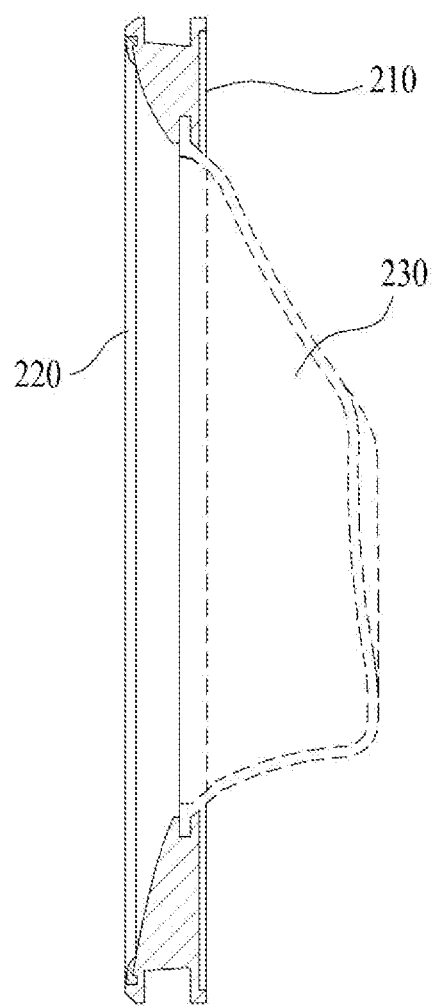
FIG. 15 is a cross-sectional view illustrating a door of the laundry treating apparatus of FIG. 1.

The door 20 will be described in detail with reference to FIGS. 14 and 15. FIG. 14 is a perspective view of the laundry treating apparatus of FIG. 1. FIG. 15 is a cross-sectional view illustrating a door of the laundry treating apparatus of FIG. 1.

Referring to FIGS. 14 and 15, the door 20 may include the inner frame 210 seated on the seating portion 140 formed on the front cover 102, and an outer frame 220 coupled to the inner frame 210. The door 20 may further include a door glass 230 coupled between the inner frame 210 and the outer frame 220. The inner frame 210 and the outer frame 220 may be detachably coupled and separably provided.

The inner frame 210 may be fabricated in a shape in conformity with a shape of the seating portion 140. The seating portion 140 may be circular, and the inner frame 210 may also be circular. The inner frame 210 may be provided in an annular shape to provide the door glass 230 on an inside of the inner frame 210.

The outer frame 220 may be coupled to an outside of the inner frame 210, and may project to an outside of the cabinet 10. An inside of the outer frame 220 may be in close contact with the front side of the front cover 102, or positioned in an outside direction of the cabinet 10 by a predetermined distance from the front side of the front cover 102. The door glass 230 may be coupled between the inside of the outer frame 220 and the inner frame 210.

Referring to FIG. 3, the outer frame 220 may project in an outside direction of the cabinet 10 or away from the front cover 102 when the door 20 is closed. The seating portion 140 may be recessed toward an inside of the cabinet 10 to receive the inner frame 210. It may be said that the outer frame 220 is coupled to project from the front side of the front cover 102 to or in the outside direction of the cabinet 10. Though the outer frame 220 may have a portion with a predetermined width received in the seating portion 140, embodiments are not so limited. That is, the outer frame 220 may be coupled to the front cover 102 without being received in the seating portion 140 such that the whole outer frame 220 projects in the outside direction of the cabinet 10.

Referring to FIG. 14, the door 20 may include a bracket 240 coupled to the seating portion 140. The door 20 may include a hinge arm 250 that projects forward from the bracket 240. The bracket 240 may be fastened to a bracket coupling recess 145 (see FIG. 7) formed in the seating portion 140. The hinge arm 250 may extend to an inside of the cabinet 10 passed through the hinge arm inserting hole 141 formed in the seating portion 140.

The hinge arm 250 may have one end provided between the inner frame 210 and the outer frame 220. The one end of the hinge arm 250 may have a hinge shaft (not shown)

provided thereto, and the hinge shaft may be rotatably coupled between the inner frame 210 and the outer frame 220.

The inner frame 210 may have a hinge arm inserting hole 211 formed therein through which the hinge arm 250 may pass.

The inner frame 210 may have one side provided with a hook 260, and the hook 260 may be coupled to a hook hole 147 formed in the seating portion 140. The hook 260 may be coupled to a locking switch provided to or in the hook hole 147.

As the outer frame 220 may be detachably provided to the inner frame 210 and may project from the front side of the front cover 102, the outer frame 220 may be fabricated in a variety of shapes regardless of shapes of the seating portion 140 and the inner frame 210. Referring to FIG. 14, the outer frame 220 may be circular, similar to the inner frame 210.

Figure 16:
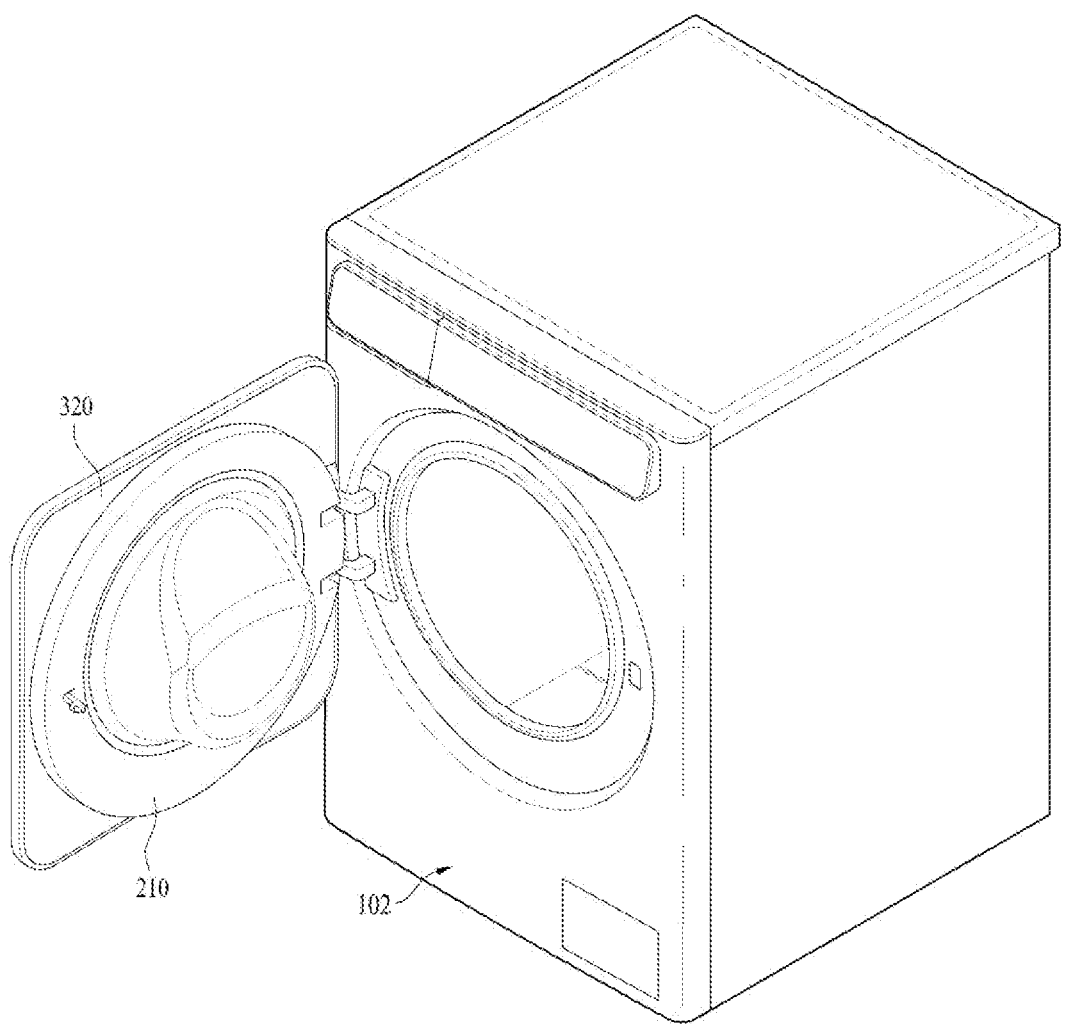
FIG. 16 is a perspective view of the laundry treating apparatus of FIG. 1, showing a door according to another embodiment, the door being opened.
Figure 17:
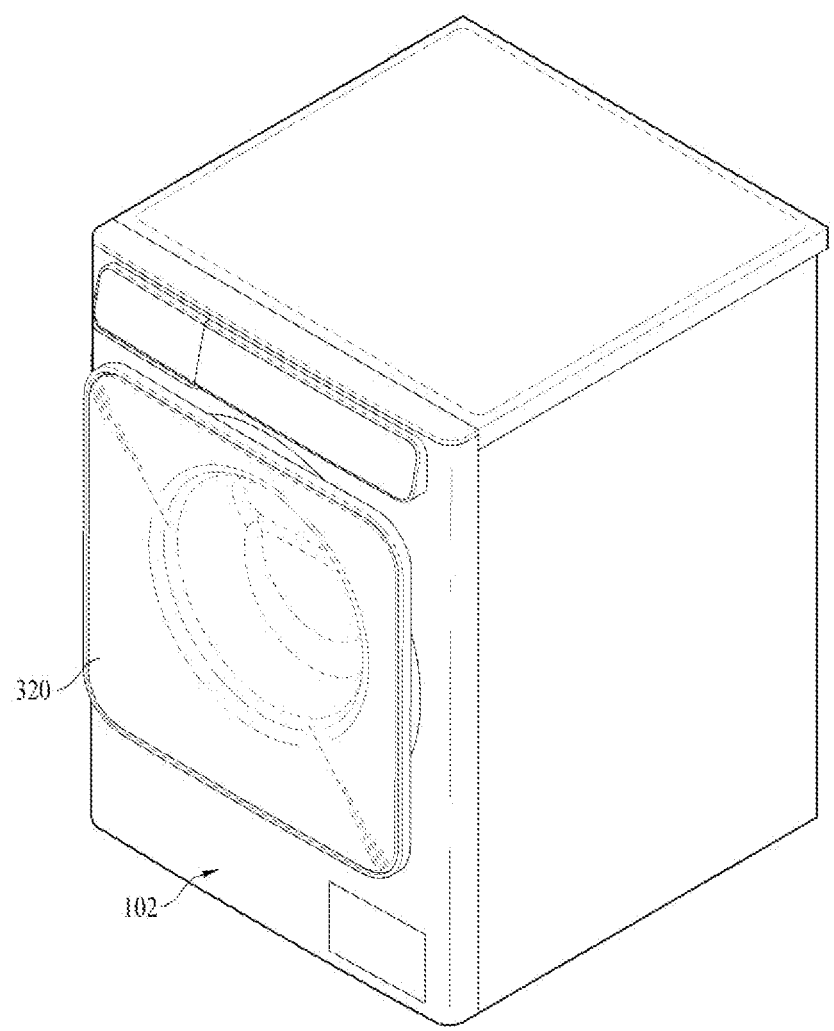
FIG. 17 is a perspective view illustrating the laundry treating apparatus in FIG. 16, with the door closed.

FIG. 16 is a perspective view of the laundry treating apparatus of FIG. 1, showing a door according to another embodiment, the door being opened. FIG. 17 is a perspective view illustrating the laundry treating apparatus in FIG. 16, with the door closed.

Referring to FIGS. 16 and 17, alternatively, outer frame 320 may be formed in a square shape. As described above, as the outer frame may project to the outside from the front side of the front cover 102, the outer frame 320 may be fabricated such that it is not in conformity with the shape of the inner frame 210 and the seating portion 140. Accordingly, degrees of freedom of fabrication of the outer frame may be enhanced.

Figure 18:
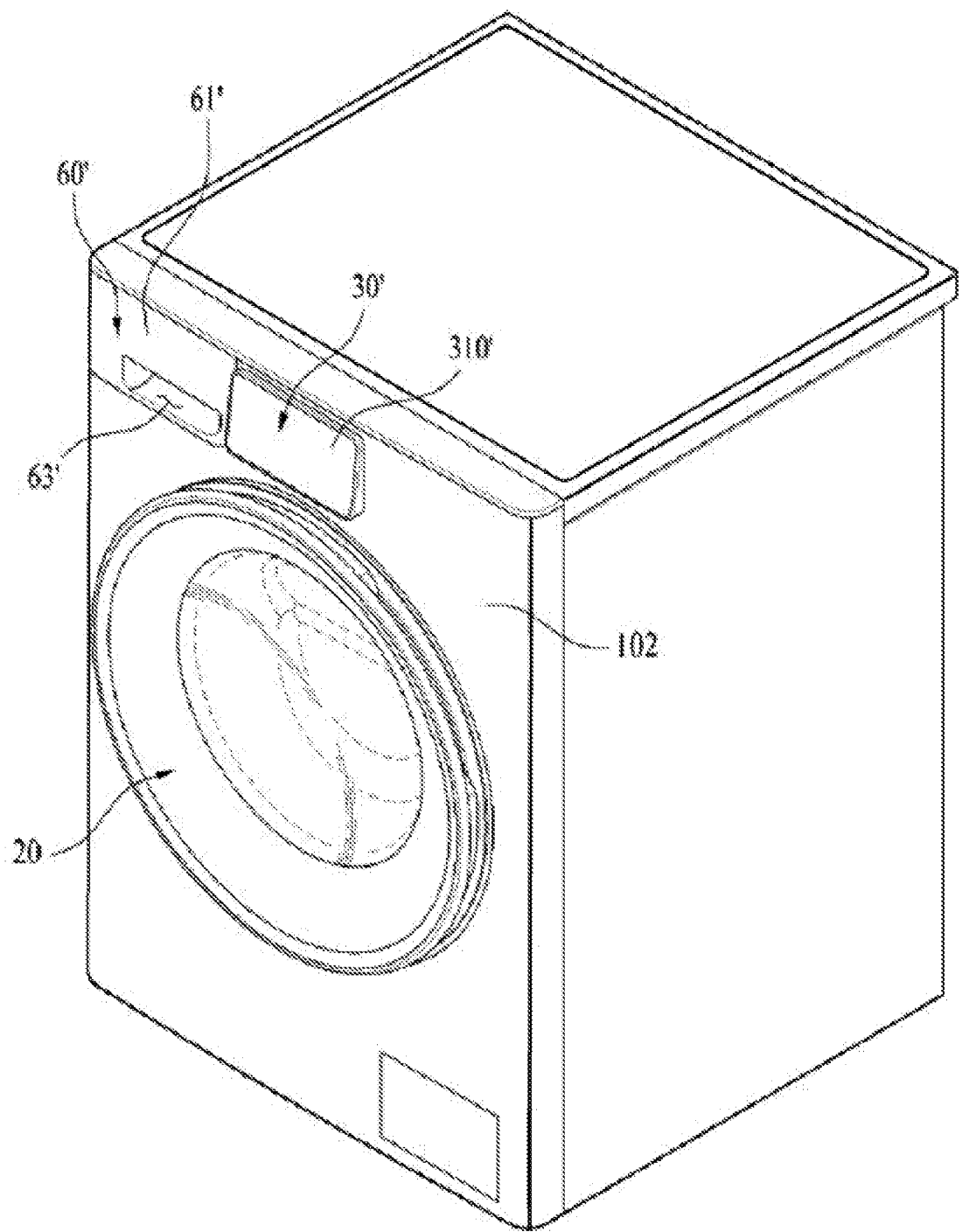
FIG. 18 is a perspective view of the laundry treating apparatus of FIG. 1, showing a control panel according to another embodiment.

FIG. 18 is a perspective view of the laundry treating apparatus of FIG. 1, showing a control panel according to another embodiment. Referring to FIG. 18, the control panel body 310 of the control panel 30 may be formed to have a short length. As the control panel body 310 may project from the front side of the front cover 102, the control panel body 310 may be fabricated in a variety of shapes and sizes within a range of shapes and sizes that do not interfere with the door 20 or the detergent supply device 60. As shown in FIG. 18, if the control panel body 310 has a relatively small aspect ratio, the drawer hand grip 63 may be formed in the drawer panel 61 of the detergent supply device 60 in the shape of a recess.

According to demands of users, laundry treating apparatuses come in a variety of shapes of products with price ranges different from one another. In order to fabricate the variety of products, it is required to provide production lines fit to the variety of products. However, if individual production lines are provided for each of the products, there are disadvantages in that a large space is required for installation of equipment for the production lines for each of the products, and a high production cost is required due to different equipment for the production lines.

As has been described above, embodiments disclosed herein have an advantage of enhancing degrees of freedom of fabrication of the control panel by projecting the control panel body 310 to the outside of the front cover. That is, embodiments disclosed herein have an advantage of applying the same front cover to laundry treating apparatuses of different price ranges.

In more detail, by applying a front cover having the same standard recess to all products and making a size of the control panel to be coupled to the recess different, the products may become different. By standardizing the front cover and the recess formed therein for application to a variety of production lines, one front cover may be applicable to a variety of production lines. In this case, as functions and configurations of the products are different from one another, sizes and functions for controlling the products may be different, too.

In this case, embodiments disclosed herein standardize the projected portion to be inserted in the recess, and allow the control panel body to be coupled to the projected portion and projected to the outside of the front cover, to enhance degrees of freedom of the body. That is, the control panel having an input and/or display provided thereto may be fabricated in a variety of shapes according to the products. Further, by fabricating the control panel bodies fit to a variety of product groups and coupling the control panel bodies fabricated thus to the standardized front covers, the same front cover may be used regardless of variations in sizes and shapes of the control panel. Eventually, as individual production lines for the front cover are not required for the variety of product groups, production cost may be saved, and space required for the equipment of the production lines may be reduced.

Additionally, by projecting the outer frame of the door to the outside of the front cover, degrees of freedom of fabrication, and shapes of the door may be enhanced. As the user's aesthetics on products are different according to shapes of the outer frame exposed to the outside, users may recognize the variety of products different from one another. In this case, as described before, if the shapes of the front covers are varied with the shapes of the outer frames, it is required to construct a variety of production lines. However, embodiments disclosed herein have an advantage of enabling a change in shape of the outer frame regardless of the shape of the front cover by coupling the outer frame projected to the outside of the front cover.

Figure 19:
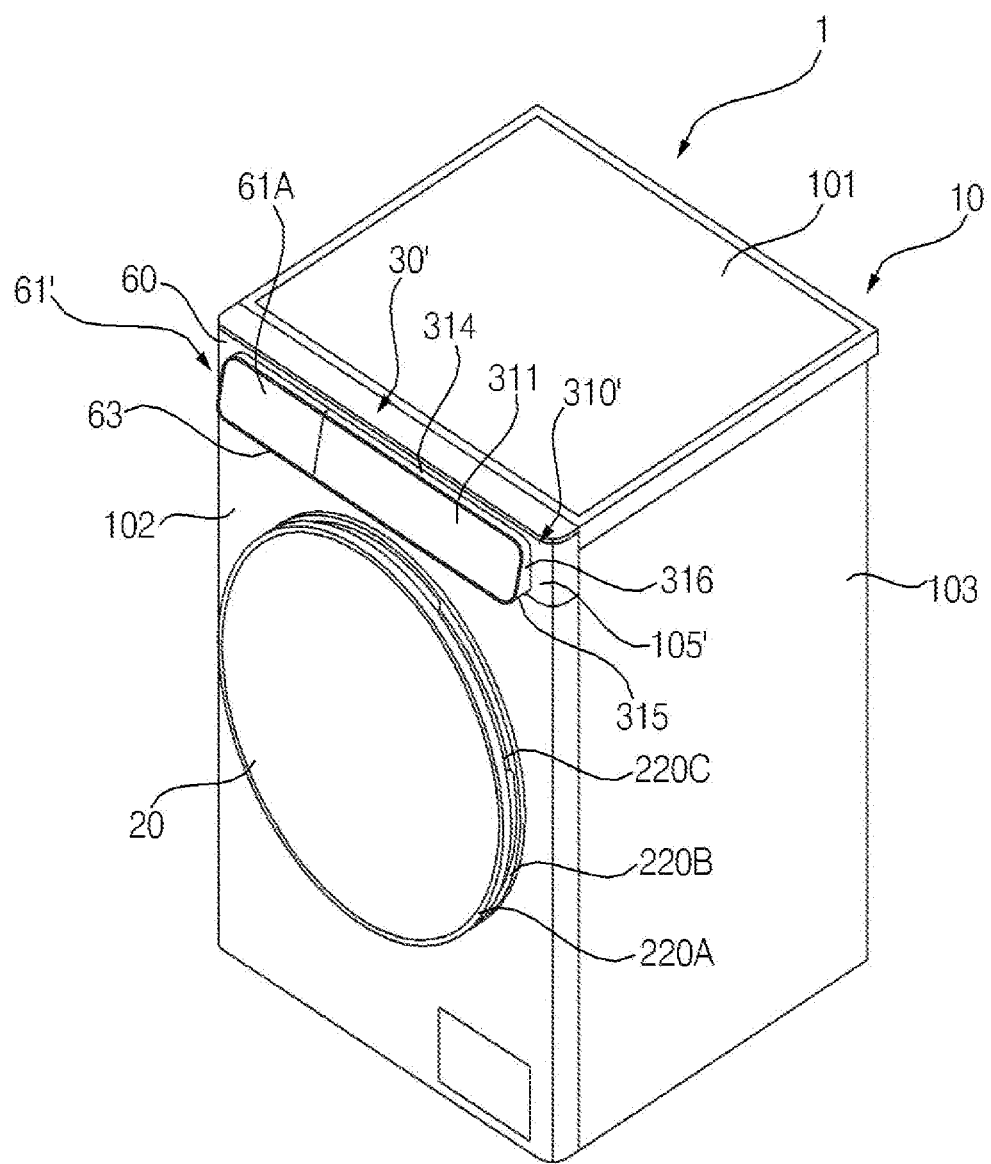
FIG. 19 is a perspective view of a laundry treating apparatus in accordance with another embodiment.
Figure 20:
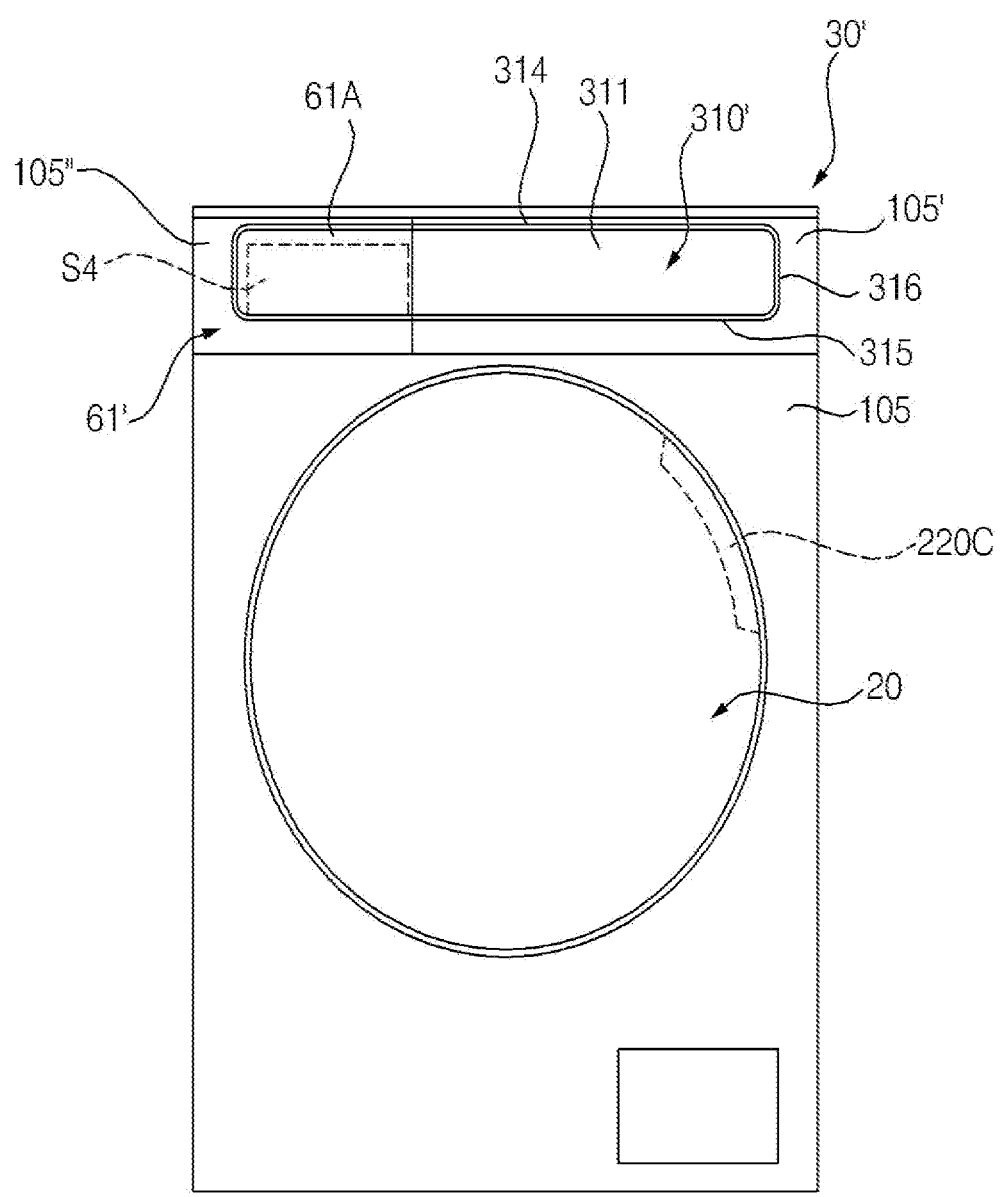
FIG. 20 is a front view of the laundry treating apparatus of FIG. 19.
Figure 21:
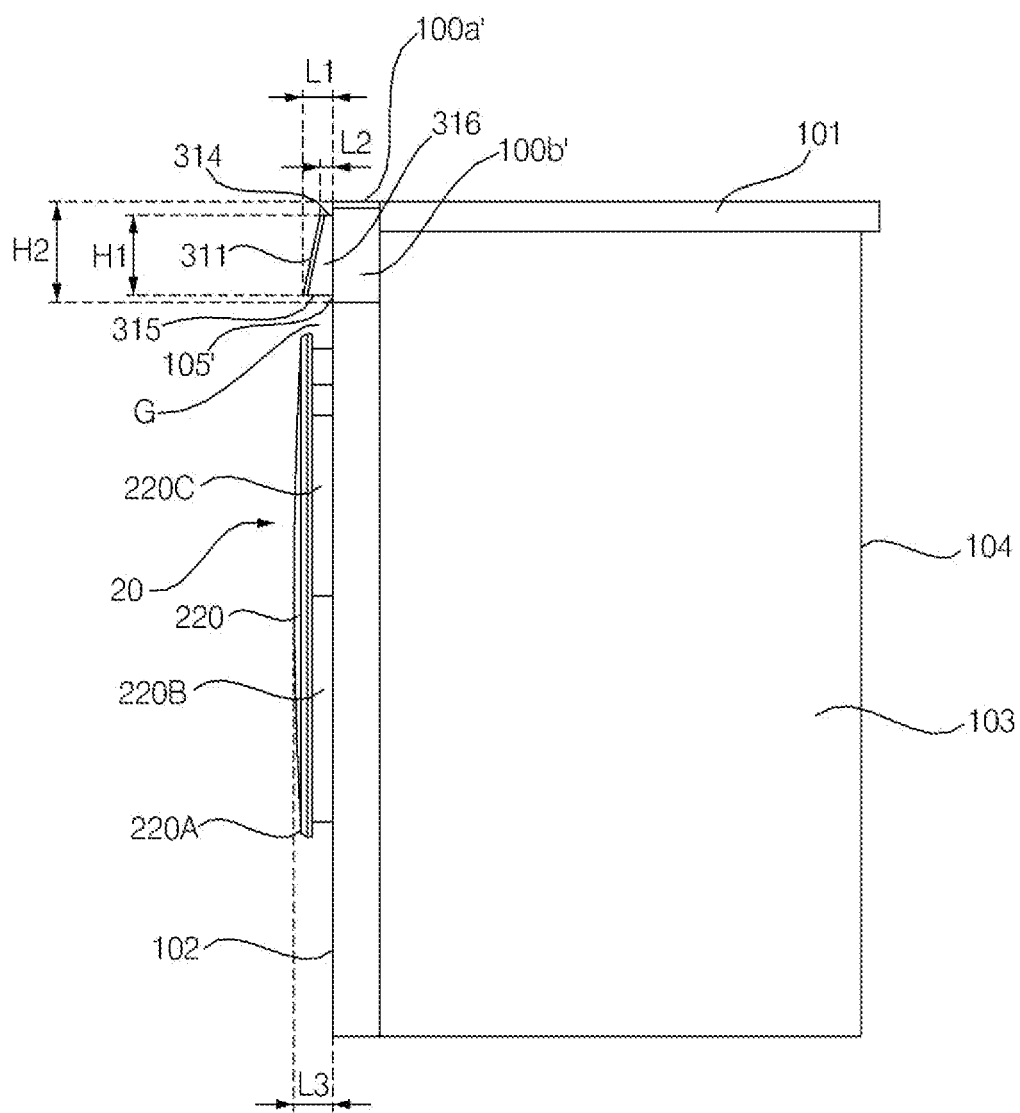
FIG. 21 is a side view of the laundry treating apparatus of FIG. 19.
Figure 22:
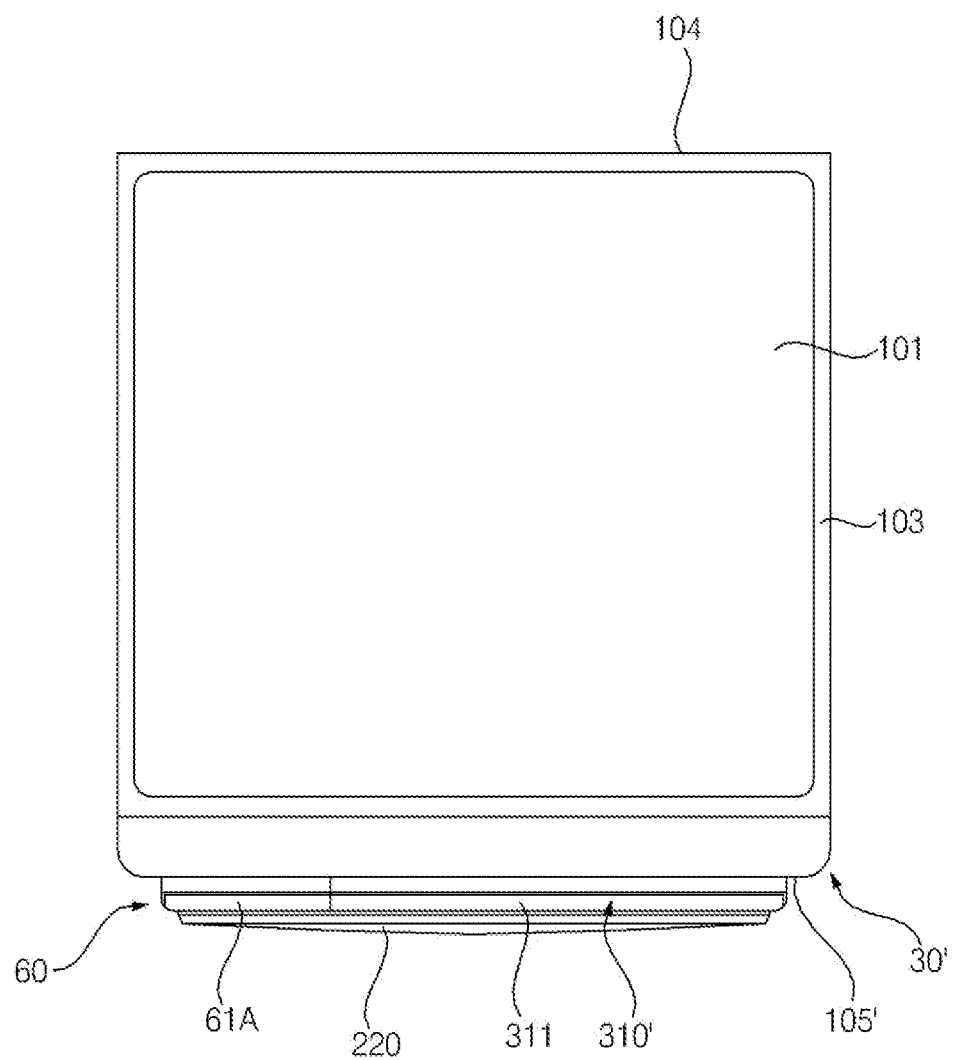
FIG. 22 is a plan view of the laundry treating apparatus of FIG. 19.
Figure 23:
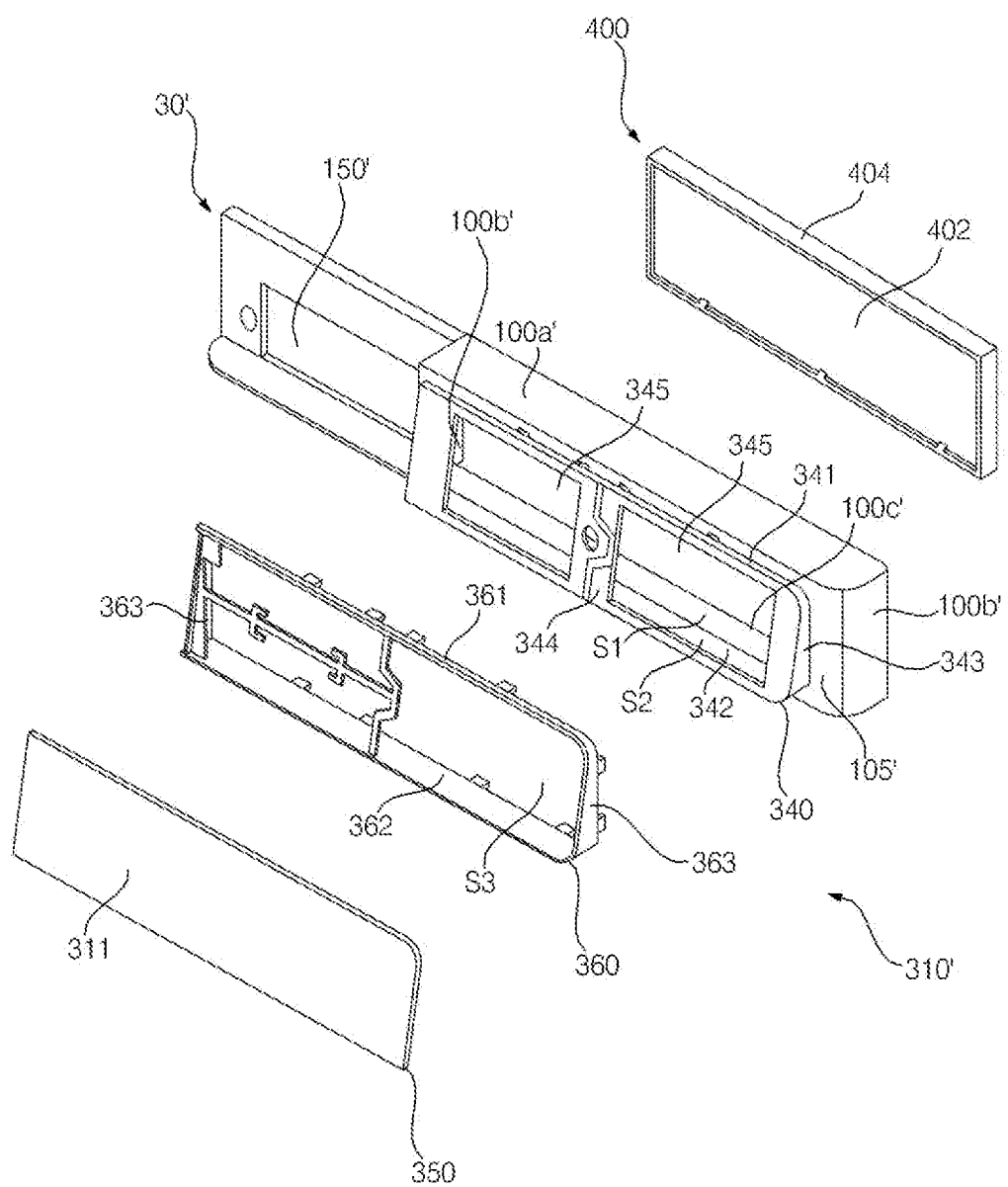
FIG. 23 is an exploded perspective view of a control panel of the laundry treating apparatus of FIG. 19.
Figure 24:
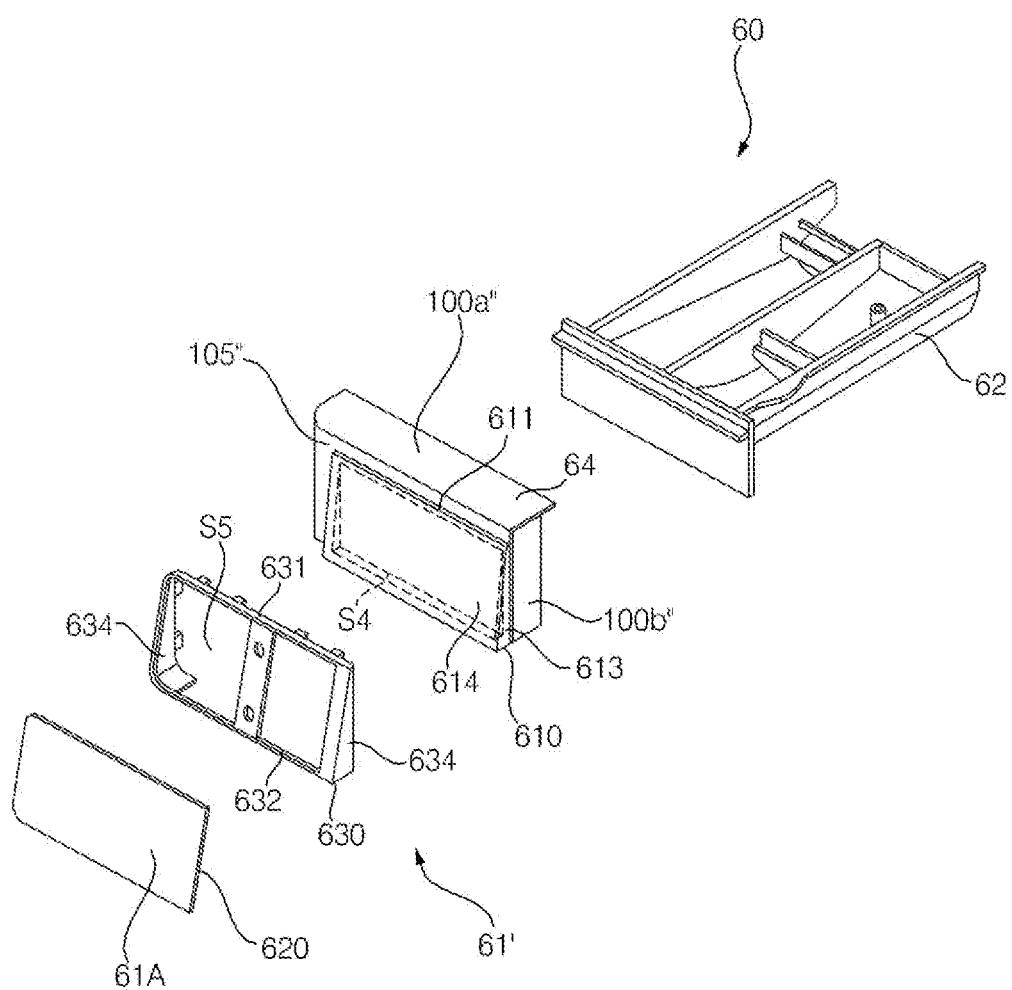
FIG. 24 is an exploded perspective view of a drawer panel of the laundry treating apparatus of FIG. 19.

A laundry treating apparatus in accordance with another embodiment will be described with reference to FIGS. 19 to 24. FIG. 19 is a perspective view of a laundry treating apparatus in accordance with another embodiment. FIG. 20 is a front view of the laundry treating apparatus of FIG. 19. FIG. 21 is a side view of the laundry treating apparatus of FIG. 19. FIG. 22 is a plan view of the laundry treating apparatus of FIG. 19. FIG. 23 is an exploded perspective view of a control panel of the laundry treating apparatus of FIG. 19. FIG. 24 is an exploded perspective view of a drawer panel of the laundry treating apparatus of FIG. 19.

In this embodiment, laundry treating apparatus 1' may include a control panel 30' including a control panel body 310' and a printed circuit board (PCB) assembly 400 (see FIG. 23). The control panel 30' may include a front plate 105'. The front plate 105' of the control panel 30' may form an exterior appearance of a portion of a front side of the laundry treating apparatus 1'. The front plate 105' of the control panel 30' may be positioned on or at an upper side of the front plate 105 of the front cover 102 described with respect to the previous embodiment.

The control panel 30' may include an upper flange 100a' formed on the front plate 105', a side flange 100b' formed on a side of the front plate 105'. The control panel 30' may include a pair of the side flanges 100b' formed opposite to each other. The control panel 30' may further include a lower flange 100c' formed on or at a lower side of the front plate 105'. The control panel 30' may be mounted to be positioned on or at an upper side of the front plate 105 of the front cover 102.

The control panel 30' may have a rear space S1 formed among the front plate 105', the upper flange 100a', the side flange 100b', and the lower flange 100c' to house at least a portion of the PCB assembly 400.

The control panel 30' may have a mounting portion 150' formed therein to mount a drawer panel 61' thereon or thereto. The mounting portion 150' may be positioned on or at a side of the side flange 100b'. The mounting portion 150' may be formed as one unit with the side flange 100b'.

The PCB assembly 400 may include a PCB 402 provided with an operation device and a display. The PCB assembly 400 may further include a PCB cover 404 having the PCB 402 mounted thereto. The PCB cover 404 may be mounted to at least one of the front plate 105', the side flange 100b', the upper flange 100a', or the lower flange 100c' with a fastening member, such as, for example, a screw.

The PCB 402 may have at least one display, and at least one switch. The display, to display information on the laundry treating apparatus, may include various electric components, such as a LED or LCD, for example. The switch, to operate the laundry treating apparatus, may include various electric components, such as a push button switch or a touch switch, for example.

The PCB assembly 400 may further include a light guide (not shown) to guide a light of the display. The light guide may be mounted to the PCB 420. The light guide may be mounted to face window 350 to be described hereinbelow.

The control panel body 310' may include the display 350, which may be positioned at an upper side of the cabinet 10 at a front side of the cabinet 10 and have a front side 311 sloped to face upward. The control panel body 310' may be arranged to project forward from the front plate 105'. The front side 311 of the control panel body 310' may be sloped to face upward. The control panel body 310' may further include an upper side 314, a lower side 315, and two opposite sides 316 exposed to an outside of the laundry treating apparatus. The control panel body 310' may have width L1 in a frontward to rearward direction of the lower side 315 larger than a width L2 in the frontward to rearward direction of the upper side 314, as shown in FIG. 21. The control panel body 310' may further have a height H1 in a vertical direction smaller than a width H2 of the front side of the front plate 105' in the vertical direction, as shown in FIG. 21.

The control panel body 310' may have a shape that projects forward from the front plate 105' three dimensionally, and the front side 311 of the control panel body 310' may be positioned sloped to face upward by a predetermined angle at a front most position of a portion arranged to project forward from the front plate 105. If the control panel body 310' does not project forward from the front plate 105', but rather, the front side 311 of the control panel body 310' is positioned at or in a vertical plane the same with the front side of the front plate 105', the front side 311 of the control panel body 310' may face only a forward direction of the laundry treating apparatus in the forward to rearward direction of the laundry treating apparatus. In this case, a whole front side of the control panel body 310' may be poorly visible from an upper side of the front of the laundry treating apparatus, and even handling of the control panel body 310' may not be easy.

However, if the control panel body 310' projects forward from the front plate 105', and the front side 311 of the control panel body 310' projected thus is sloped by a predetermined angle to face an upper side of the front of the laundry treating apparatus, when a user looks at the front side 311 of the control panel body 310' from the upper side of the front of the laundry treating apparatus, the user may look at the whole front side 311 of the control panel body 310' in a slope direction, and may conveniently input an operation order on the laundry treating apparatus through the front side 311 of the control panel body 310'.

If the control panel body 310' does not project forward from the front plate 105', but rather, is formed in a shape in which a portion of the upper side of the control panel 30' is recessed sloped by a predetermined angle, as described above, the recessed portion of the control panel 30' may be visible from the upper side of the front of the laundry treating apparatus, and operation thereof may be convenient. However, a sloped structure of the portion of the upper side of the control panel 30' may reduce an inside space of the laundry treating apparatus, making utilization of the inside space of the laundry treating apparatus poor.

On the other hand, if the control panel body 310' projects forward from the front plate 105' and the front side 311 of the control panel body 310' is sloped by the predetermined angle to face the upper side of the front of the laundry treating apparatus, utilization of the inside space of the laundry treating apparatus may be enhanced, and the front side 311 of the control panel body 310' may be clearly visible to a user, such that an operation order on the laundry treating apparatus may be input easily through the front side 311 of the control panel body 310'.

Similar to the previous embodiment, the door 20 may have the outer frame 220, which may form an exterior appearance thereof, and when the door 20 is closed, at least a portion of the outer frame 220 may be positioned to project to the outside of the cabinet 10. The door 20 may have a configuration and operation identical to the previous embodiment, and detailed description of the configuration and the operation identical to the previous embodiment has been omitted.

The door 20, the drawer panel 61', and the display 350 may project forward from the cabinet 10. The door 20 may have substantially the same projected width as the window 350. The door 20 may have a portion facing the lower side 315 of the control panel body 310' in a vertical direction. A gap G smaller than the height H1 of the control panel body 310' may be formed between the door 20 and the control panel body 310'. The gap G between the door 20 and the control panel body 310' may be an empty space for a user to hold the outer frame 220 projected to the outside of the cabinet 10 with one hand. The user may hold the door 20 easily with means other than hand grip 200c, which is discussed hereinbelow.

The gap G between the door 20 and the control panel body 310' may have a smallest height which would allow for a user's finger to be inserted therein, and a largest height that can make the door 20 and the control panel body 310' provide a sense of unity on the whole. If the gap G between the door 20 and the control panel body 310' is lower than the height H1 of the control panel body 310', the door 20 and the control panel body 310' may provide the sense of unity on the whole together with the front cover 102.

The outer frame 220 may have the hand grip 220c formed at an outside circumference 220b thereof. The hand grip 220c may include a recess formed at an outside circumferential surface thereof. The hand grip 220c may be formed at the outer frame 220 to face the lower side 315 of the control panel body 310' in the vertical direction.

When closed, the door 20 may have at least a portion that projects forward from the front plate 105 of the front cover 102, and a largest projected width L3 in a frontward to rearward direction of the door 20 may be substantially the same as, or larger than the width L2 of the control panel body 310'. In this case, the width L2 of the control panel body 310' may be substantially the same as a width of the lower side 315 of the control panel body 310' in the forward to rearward direction.

The drawer panel 61' may be arranged at or on the control panel 30'. The drawer panel 61' may have a configuration and operation identical to the previous embodiment, and detailed description of the configuration and operation identical to the previous embodiment have been omitted.

The drawer panel 61' may have a sloped surface 61a positioned on substantially the same plane with the front side 311 of the control panel body 310'. The drawer panel 61' may have the sloped surface 61a positioned on substantially the same plane with the front side 311 of the window 350. The sloped surface 61a may be positioned on a side of the front side 311 of the window 350.

The drawer panel 61' may include the drawer hand grip 63 having the sloped surface 61a. The drawer panel 61' may form a hand grip space S4 having an opened lower side in or at a rear of the drawer hand grip 63. The hand grip space S4 formed in the drawer panel 61' may be formed by the cut-away portion 650 the same with the previous embodiment. When the door 20 is closed, the hand grip space S4 may face a portion of the outside circumferential surface 220b of the door 20.

The control panel body 310' will be described in more detail with reference to FIG. 23. The control panel body 310' may include a front body portion 340 that projects forward from the front plate 105', and the window 350 arranged at the front body portion 350 to have the front side 311 sloped to face upward. The control panel body 310' may further include a deco 360 that surrounds circumferences of the front body portion 340 and the window 350.

The front body portion 340 may form a space S2 therein. The space S2 formed in the front body portion 340 may be a space formed in front of the rear space S1, and the front space S2 may have a size smaller than the rear space S1.

The front body portion 340 may include an upper side 341, a lower side 342, and sides 343 that project forward from the front plate 105 of the control panel body 310' as one unit thereof. The upper side 341 of the front body portion 340 and the lower side 342 of the front body portion 340 may extend parallel to each other, and each of which may extend in a lengthwise direction of the control panel body 310'. The lower side 342 of the front body portion 340 may have a width in the forward to rearward direction larger than a width of the upper side 341 of the front body portion 340 in the forward to rearward direction.

The sides 343 of the front body portion 340 may connect the upper side 341 of the front body portion 340 to the lower side 342 of the front body portion 340, and may project forward from the front plate 105' as one unit. The front body portion 340 may include a pair of the sides 343 that face each other in a lateral direction.

The front space S2 may be formed by the upper side 341, the lower side 342, and the sides 343 of the front body portion 340, to receive at least a portion of the PCB assembly 400 therein. The front space S2 of the front body portion 340 may have a portion of the light guide of the PCB assembly 400 positioned therein.

The front side of the front body portion 340 may further include a front plate 344 sloped to face upward forwardly. The front plate 344 may have a window seating surface to seat the window 350 thereon. The front plate 344 may be formed to be sloped by a predetermined angle to face upward forwardly. If the front body portion 340 includes the front plate 344, the front plate 344 may have an opening 345 to allow electric components to be mounted to the PCB 402, more particularly, a portion of the touch switch to be positioned in contact with the window 350.

The laundry treating apparatus may have the front plate 344 sloped at an acute angle from a horizontal plane. The smaller the angle from a horizontal plane, the more the front side 311 of the control panel body 310' may be sloped to face upward to a maximum degree, while the larger the angle from a horizontal plane, the more the front side 311 of the control panel body 310' may be sloped to face forward to a maximum degree.

If the deco 360 is not included, the control panel body 310' may have the upper side 341, the lower side 342, and the sides 343 of the front body portion 340 exposed to the outside. In this case, the upper side of the front body portion 340 may be the upper side 314 of the control panel body 310', the lower side of the front body portion 340 may be the lower side 315 of the control panel body 310', and the sides of the front body portion 340 may be the sides 316 of the control panel body 310'.

The window 350 may be formed in a plate shape. The window 350 may display information for the laundry treating apparatus to the outside. The display may be positioned on the upper side of the cabinet 10 in front of the front side of the cabinet 10 with the front side 311 thereof sloped to face upward. Light emitted from the display may be incident on the window 350 for the user to watch the window 350 to notice information on the laundry treating apparatus.

The window 350 may be an operation panel for a user to touch or apply pressure thereto for operation of the laundry treating apparatus. The window 350 may further include a touch screen. The user may touch or apply pressure to the window 350, and may handle a switch on the PCB assembly 400. The window 350 may be positioned in front of the front body portion 340. Of course, the window 350 may be fastened to at least one of the front body portion 340, the PCB assembly 400, or the deco 360 with, for example, fastening members, such as screws, fastened with a hooking device, such as a hook, or attached with an adhesive member, such as two-sided tape. The front side of the window 350 may be the front side 311 of the control panel body 310'.

The deco 360 may include at least one of an upper side 361, a lower side 362, or a side 363. It is possible to arrange the deco 360 to surround the upper side 341, the lower side 342, the left side 343, and the right side 343 of the front body portion 340. The deco 360 may include a pair of opposite sides 363, the upper side 361, and the lower side 362. The pair of sides 363 may surround the upper side 341, the lower side 342, the left side 343, and the right side 343 of the front body portion 340, and the upper side 361, the lower side 362, and the pair of the sides 363 may surround the upper side, the lower side, the left side, and the right side of the window 350.

The deco 360 may have a space S3 formed among the upper side 361, the lower side 362, and the sides 363. The deco 360 may have one or more hooks 365 that hold the window 350 to prevent the window 350 from falling off the deco 360 in a frontward to rearward direction of the deco 360. The one or more hooks may project from the deco 360 toward the space S3. The deco 360 may function as a window holder to secure the window 350. The deco 360 may include all of the upper side 361, the lower side 362, and the sides 363. The deco 360 may have a metal layer coated to or on an outside surface thereof. For example, the deco 360 may have the outside surface coated with chromium to improve ornamental beauty of the laundry treating apparatus.

If the deco 360 surrounds the upper side 341, the lower side 342, the left side 343, and the right side 343 of the front body portion 340, the upper side 361 of the deco 360 may be the upper side 314 of the control panel body 310', the lower side 362 of the deco 360 may be the lower side 315 of the control panel body 310', and the sides 363 of the deco 360 may be the sides 316 of the control panel body 310'.

The PCB assembly 400 may have at least a portion thereof placed in the space S2 of the front body portion 340. The PCB assembly 400 may be mounted to position the light guide between the PCB 402 and the window 350. At least a portion of the light guide may be positioned between the front space S2 of the front body portion 340, and at least a portion of the PCB cover 404 may be positioned in the rear space S1.

The drawer panel 61' will be described in more detail with reference to FIG. 24. The drawer panel 61' may include the detergent box 62 to hold detergent. The drawer panel 61' may include an outer body 64 exposed to an outside.

The detergent box 62 may have a detergent holding space formed therein to hold detergent. The detergent box 62 may be formed as one unit with the outer body 64, or may be fastened to the outer body 64 with a fastening member, such as a screw, for example.

The outer body 64 may include a front plate 105". The front plate 105" of the outer body 64 may form an exterior appearance of a portion of the front side of the laundry treating apparatus 1'. The outer body 64 may include an upper flange 100a" formed on an upper side of the front plate 105". The outer body 64 may further include side flanges 100b" formed at sides of the front plate 105". The outer body 64 may have a pair of the side flanges 100b" formed to face each other. The control panel 30' may be positioned on or at an upper side of the front plate 105 of the front cover 102.

The drawer panel 61' may include a drawer body portion 610 that projects forward, and a drawer cover 620 having a sloped surface 61a arranged at the drawer body portion 610 and positioned on substantially the same plane as the front side 311 of the control panel body 310'. The drawer panel 61' may further include a drawer deco 630 that surrounds an upper side, a left side, a right side, and a circumference of the drawer cover 620.

The drawer body portion 610 may project forward from the front plate 105" of the drawer panel 61'. The outer body 64 may have a hand grip identical to the hand grip in accordance with the previous embodiment formed thereon. The drawer body portion 610 may function as a hand grip together with the drawer cover 620. The drawer body portion 610 may project from the front plate 105" of the drawer panel 61' three dimensionally.

The drawer body portion 610 may be positioned on a side of the front body portion 340 of the control panel body 310' shown in FIG. 23, and may have a width in a left/right or lateral direction smaller than the front body portion 340 of the control panel body 310'.

The drawer body portion 610 may include an upper side 611, and sides 613 that project forward from the front plate 105" of the drawer panel 61' as one unit therewith. The upper side 611 of the drawer body portion 610 may extend in the left/right or lateral direction on an upper side of the front plate 105".

The drawer body portion 610 may include a pair of the sides 613 in the left/right or lateral direction that face each other. The sides 613 of the drawer body portion 610 may project forward from the front plate 105" of the outer body 64 as one unit therewith.

The drawer body portion 610 may have a front side with a front plate 614 sloped to face upward forwardly. The front plate 614 of the drawer body portion 610 may have a cover seating surface for the drawer cover 620 to be seated thereon. The front plate 614 of the drawer body portion 610 may be formed sloped to face upward at a predetermined angle forwardly. The front plate 614 of the drawer body portion 610 may be sloped at an angle the same as the front plate 344 of the drawer body portion 610 shown in FIG. 23.

The drawer body portion 610 may have an opened lower side, and the drawer body portion 610 may have a hand grip space S4 formed among the upper side 611, the sides 613, and the front plate 614. The drawer cover 620 may be formed in a plate shape. The drawer cover 620 may be positioned forward of the front side of the cabinet 10 on the upper side of the cabinet 10 to have the front surface 61a sloped to face upward. The drawer cover 620 may be arranged in front of the drawer body portion 610. The drawer cover 620 may have a height the same as a height of the window 350, and may be positioned on or at a side of the window 350, as shown in FIG. 23. As the drawer cover 620 is positioned on the side of the window 350, as shown in FIG. 23, the drawer cover 620 may provide a sense of unity with the window 350, thereby making the upper side of the laundry treating apparatus appear luxurious.

Of course, it is possible to fasten the drawer cover 620 to at least one of the drawer body portion 610 or the drawer deco 630 with a fastening member, such as screw, or with a hooking device, such as hook, or attached with an adhesive member, such as a two-sided tape, for example.

The front side of the window 350 may be the front side 311 of the control panel body 310'.

The drawer deco 630 may include at least one of an upper side 631, a lower side 632, and a side 634. The drawer deco 630 may be arranged to surround the upper side 611, the left side 613, and the right side 613 of the drawer body portion 610. The drawer deco 630 may include a pair of opposite sides 634, and the upper side 631, the lower side 632, and the pair of the sides 634 may surround the upper side 611, the left side 613, and the right side 613 of the drawer body portion 610.

The drawer deco 630 may have a space S5 formed among the upper side 631, the lower side 632, and the side 634. The drawer deco 630 may have one or more hooks 635 formed thereon to hold the drawer cover 620 such that the drawer cover 620 does not fall off in a front or frontward direction. The one or more hooks 635 may project from the drawer deco 630 toward the space S5. The drawer deco 630 may function as a cover holder to secure the drawer cover 620. The drawer deco 630 may include all of the upper side 611, the lower side 612, and the side 634. The upper side 611, the lower side 612, and the side 634 of the drawer deco 630 may surround the circumference of the drawer cover 620.

The drawer deco 630 may have a metal layer coated to or on an outside surface thereof. For example, the drawer deco 630 may have a chromium layer coated to or on the outside surface, which may improve ornamental beauty of the laundry treating apparatus.

As set forth above, the PCB assembly 400 may have at least a portion thereof inserted into the space S2 of the front body portion 340. The PCB assembly 400 may have the light guide mounted to be positioned between the PCB 402 and the window 350. At least a portion of the light guide may be positioned in the front space S2 of the front body portion 340, and at least a portion of the PCB cover 404 may be positioned in the rear space S1. With a smaller portion of the PCB assembly 400 positioned in the rear space S1 and a larger portion of the PCB assembly 400 positioned in the front space S2, more empty space may be provided within the laundry treating apparatus 1'. Therefore, the portion of the PCB assembly 400 inserted in the front space S2 of the front body portion 340 may be as much as possible.

Figure 25:
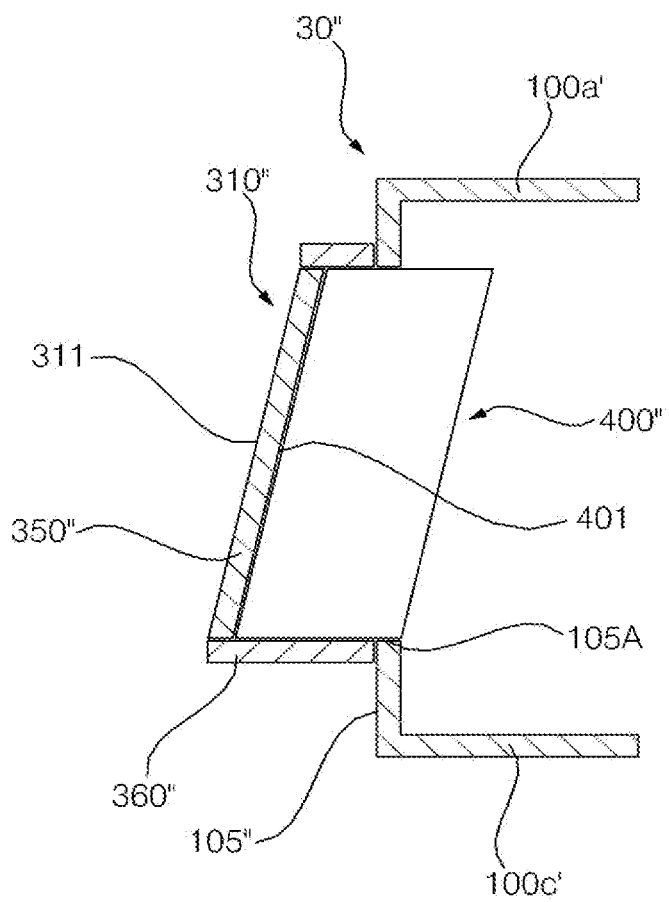
FIG. 25 is a schematic cross-sectional view of a control panel of a laundry treating apparatus in accordance with another embodiment.

A control panel of a laundry treating apparatus in accordance with another embodiment will be described in detail with reference to FIG. 25. FIG. 25 is a schematic cross-sectional view of a control panel of a laundry treating apparatus in accordance with another embodiment.

Referring to FIG. 25, the laundry treating apparatus may include a PCB assembly 400" having a control panel 30" arranged to pass through an opening 105a formed in the front plate 105". The control panel body 310" may include a window 350" arranged at the PCB assembly 400" to have a front side sloped to face upward. The control panel body 310" may further include a deco 360" that surrounds a circumference of the PCB assembly 400" and a circumference of the window 350".

As a configuration and operation of the laundry treating apparatus of this embodiment is identical or similar to the previous embodiment except for the control panel 30", detailed description of the configuration and operation of this laundry treating apparatus of the embodiment have been omitted.

The PCB assembly 400" may have a front portion positioned in front of the opening 105a, and a rear portion positioned at a rear of the opening 105a. The PCB assembly 400" may have a front side 401 sloped by a predetermined angle in a direction to face upward forwardly.

As the PCB assembly 400" may have a configuration and operation identical or similar to the PCB assembly 400 in the previous embodiment except that the PCB assembly 400" may be arranged to pass through the opening 105a formed in the front plate 105", detailed description of the configuration and operation have been omitted.

The window 350" may be arranged in front of the PCB assembly 400" having a front portion that projects forward, and more specifically, in front of the front side 401 of the PCB assembly 400". As a configuration and operation of the window 350" are identical or similar to the window 350 in the previous embodiment except that the window 350" may be arranged in front of the front side 401 of the PCB assembly 400", detailed description of the configuration and operation have been omitted.

Similar to the previous embodiment, the deco 360" may include all of the upper side 361, the lower side 362, and the side 363. The upper side 361, the lower side 362, and the side 363 may surround a circumference of the PCB assembly 400" and a circumference of the window 350.

Embodiments disclosed herein provide a laundry treating apparatus which enables high utilization of an inside space, easy notice of information to a user, and easy operation by a user. Further, embodiments disclosed herein provide a laundry treating apparatus with improved degrees of freedom of fabrication of a control panel.

Embodiments disclosed herein provide a laundry treating apparatus that may include a cabinet having a laundry opening formed therein, a door mounted to the cabinet to open/close the laundry opening, and a control panel arranged at or on the cabinet. The control panel may include a control panel body projected forward from a front plate. A front side of the control panel body may be sloped to face upward.

The control panel body may include an upper side, a lower side, and two opposite sides exposed to an outside of the laundry treating apparatus. The control panel body may have a front/rear direction width of the lower side larger than a front/rear direction width of the upper side. The control panel body may have a vertical direction height smaller than a vertical direction height of the front plate.

The control panel body may include a front body portion projected forward from the front plate, and a window arranged at the front body portion to have the front side sloped to face upward. The control panel body may further include a deco that surrounds a circumference of the front body portion and a circumference of the window, altogether.

The front body portion may have a space formed therein, and the control panel may further include a printed circuit board (PCB) assembly having at least a portion thereof inserted in the space. The control panel may include a PCB assembly arranged to pass through an opening formed in the front plate, and the control panel body may include a window arranged at the PCB assembly to have a front side sloped to face upward, and a deco that surrounds a circumference of the PCB assembly and a circumference of the window, altogether.

The door may have a portion that faces a lower side of the control panel body in a vertical direction. A gap between the control panel body and the door may be smaller than a height of the control panel body.

The door may have an outer frame that forms an exterior appearance of the door. The outer frame may be positioned such that at least a portion of the outer frame projects to an outside of the cabinet when the door is closed. The outer frame may have an outside circumferential surface having a hand grip formed thereon. The hand grip may include a recess formed in the outside circumferential surface of the outer frame. The outer frame may have a hand grip formed thereon that faces the lower side of the control panel body in a vertical direction of the door.

When the door is closed, the door may have a largest projected width in a front/rear direction larger than a largest projected width in a front/rear direction of the door. When the door is closed, the control panel body may have a largest projected width in a front/rear direction the same with a largest projected width in a front/rear direction of the door, substantially.

The laundry treating apparatus as may further include a drawer panel arranged at the control panel. The drawer panel may have a sloped side positioned on a same plane with the front side of the control panel body, substantially.

The drawer panel may include a drawer hand grip having the sloped side. The drawer panel may have a hand grip space having an opened lower side in rear of the drawer hand grip, and the hand grip space may face a portion of an outside circumferential surface of the door when the door is closed.

The laundry treating apparatus may further include a drawer panel arranged at the control panel. The drawer panel may include a drawer body portion that projects forward, and a drawer cover arranged at the drawer body portion to have a sloped side positioned on a same plane with the front side of the control panel body, substantially. The drawer panel may further include a drawer deco that surrounds an upper side, a left side, and a right side of the front body portion and a circumference of the drawer cover, altogether.

Embodiments disclosed herein further provide a laundry treating apparatus that may include a cabinet that forms an exterior appearance of the laundry treating apparatus, and a display positioned on an upper side of the cabinet in front of a front side of the cabinet to have a front side sloped to face upward. The laundry treating apparatus may further include a drawer panel having a sloped side positioned on a same plane with the front side of the display. The sloped side may be positioned on a side of the front side of the display.

The laundry treating apparatus may further include a door mounted to the cabinet. The door may have a projected width the same with the display, substantially. The display, the door, and the drawer panel may be projected forward from the cabinet.

The laundry treating apparatus according to embodiments disclosed herein may have at least the following advantages.

The outward projection of the control panel body may enhance degrees of freedom of fabrication of the control panel. The projection of the outer frame of the door to the outside of the cabinet may enhance degrees of freedom of fabrication and a shape of the door.

Utilization of the inside of the cabinet may be enhanced. A distance between a lower side of a front side of the control panel body and eyes of the user may be minimized, enabling a user to notice information which the control panel displays more easily. Further, availability of handling of the control panel body in a sloped direction may enable the user, standing in front of the laundry treating apparatus, to handle the control panel conveniently and easily without giving overstrain to a wrist of the user.

It will be apparent to those skilled in the art embodiments are not intended to be limited to the above-described embodiments, and various changes or modifications may be made therein without departing from the scope and the technical sprit.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A laundry treating apparatus comprising:
   a cabinet including a front cover having a first opening through which laundry items are inserted;
   a door mounted to the front cover and configured to open and close the first opening, wherein the cabinet includes a seating portion recessed toward an inside of the cabinet from the front cover;
   a control panel comprising:
      a first front plate detachably disposed on the front cover; and
      a control panel body that protrudes forwardly from the first front plate and located further forward than the front cover, wherein a front side of the control panel body is sloped to face in an upward direction of the laundry treating apparatus;
   wherein the control panel body includes:
      a front body that projects forward from the first front plate;
      a window arranged on the front body that covers all of a front side of the front body, a front side of the window being sloped to face in the upward direction of the laundry treating apparatus; and
      a deco that surrounds an upper side, a lower side, and at least one of two opposite sides of the front body and an upper side, a lower side, and at least one of two opposite sides of the window,
   a drawer panel comprising:
      a detergent box that holds a detergent;
      a second front plate detachably disposed on the detergent box and the control panel;
      a drawer body that protrudes forward from the second front plate, the drawer body located further forward than the front cover, and the drawer body having a hand grip space opened in a downward direction;
      a drawer cover disposed in front of the drawer body and having a sloped surface facing in the upward direction of the laundry treating apparatus; and
      a drawer deco detachably disposed on the drawer body and that holds the drawer cover,
   wherein the door comprises:
      an inner frame received in the seating portion and having an inner surface configured to face the seating portion when the door is in a closed position; and
      an outer frame comprising:
         an outer circumference attached to the inner frame and configured to be exposed to an outside of the cabinet when the door is in the closed position;
         an outer edge that protrudes radially outward from a front end of the outer circumference; and
         a hand grip recessed radially inward from the outer circumference and located between the outer edge and a front surface of the front cover, wherein the outer circumference of the outer frame faces a lower surface of the control panel body and a lower surface of the drawer panel in a vertical direction,
      wherein a gap is formed between the control panel body and the outer circumference of the outer frame, and the gap is formed between the drawer panel and the outer circumference of the outer frame, wherein a portion of the gap is formed between the outer edge and the front surface of the front cover, and the outer edge faces the lower surface of the control panel and the lower surface of the drawer panel in the vertical direction,
      wherein the hand grip space of the drawer panel extends upwardly in the vertical direction at a rear of the sloped surface of the drawer cover, and the hand grip space of the drawer panel has an open lower side that faces the outer circumference of the outer frame in the vertical direction, and wherein the hand grip space of the drawer panel configured to receive a hand of a user inserted upwardly thereinto in the vertical direction.

2. The laundry treating apparatus of claim 1, wherein the outer frame has a larger cross-sectional area than the inner frame.

3. The laundry treating apparatus of claim 1, further comprising a door glass provided between the inner frame and the outer frame.

* * * * *